United States Patent [19]

Suzuki

[11] Patent Number: 5,147,810
[45] Date of Patent: Sep. 15, 1992

[54] PROCESS FOR PRODUCING SEMICONDUCTOR DEVICE

[75] Inventor: Kenichi Suzuki, Minato, Japan

[73] Assignee: Oki Electric Industry Co., Ltd., Tokyo, Japan

[21] Appl. No.: 639,064

[22] Filed: Jan. 9, 1991

[30] Foreign Application Priority Data

Jan. 9, 1990 [JP] Japan .................................. 2-989

[51] Int. Cl.$^5$ .......................................... H01L 21/265
[52] U.S. Cl. ........................................ 437/31; 437/33; 437/162; 437/909; 148/DIG. 11; 148/DIG. 124
[58] Field of Search ............... 437/31, 33, 160, 909, 437/162, 31; 148/DIG. 10, DIG. 11, DIG. 124; 357/34, 56, 59 H

[56] References Cited

U.S. PATENT DOCUMENTS

| | | | |
|---|---|---|---|
| 4,433,470 | 2/1984 | Kameyama et al. | 357/59 H |
| 4,757,027 | 7/1988 | Vora | 437/162 |
| 4,887,145 | 12/1989 | Washio et al. | 437/160 |
| 5,010,026 | 4/1991 | Gomi | 437/162 |
| 5,024,956 | 6/1991 | Van Der Velden | 437/162 |
| 5,039,624 | 8/1991 | Kadota | 437/31 |

OTHER PUBLICATIONS

Extended Abstracts of the 16th Conference on Solid State Devices and Material, Kobe, 1984, pp. 209-212.

Primary Examiner—Brian E. Hearn
Assistant Examiner—Tuan Nguyen
Attorney, Agent, or Firm—Wenderoth, Lind & Ponack

[57] ABSTRACT

A process for producing a semiconductor device for an integrated circuit is disclosed. A patterned structure made of first polycrystalline silicon and a first thermal oxide film is formed on an underlayer or foundation. A protrusion or raised portion is formed by using the patterned structure as a mask. A first insulating region is formed around the protrusion. After removing the first thermal oxide film an remaining portion of the patterned structure is thermally oxidized to obtain second thermal oxide film while the peripheral area of the surface of the protrusion is exposed. A second polycrystalline silicon pattern layer with a high impurity concentration is formed so as to contact with the exposed surface of the protrusion and with sideface of the second thermal oxide film, and to extend onto the first insulating layer. The pattern layer is subject to thermal treatment to form a control electrode with a third thermal oxide film thereon and to form a low resistance region for a part of a control region in the protrusion. Thus, the portion of the control electrode contacting with the second thermal oxide film is formed in self-alignment manner. At later stages, a remaining part of the control electrode region and a first principal electrode region are sequentially formed in a self-alignment manner in the protrusion while the residual are of the protrusion serves as a second electrode region.

25 Claims, 19 Drawing Sheets

FIG_1 C
PRIOR ART
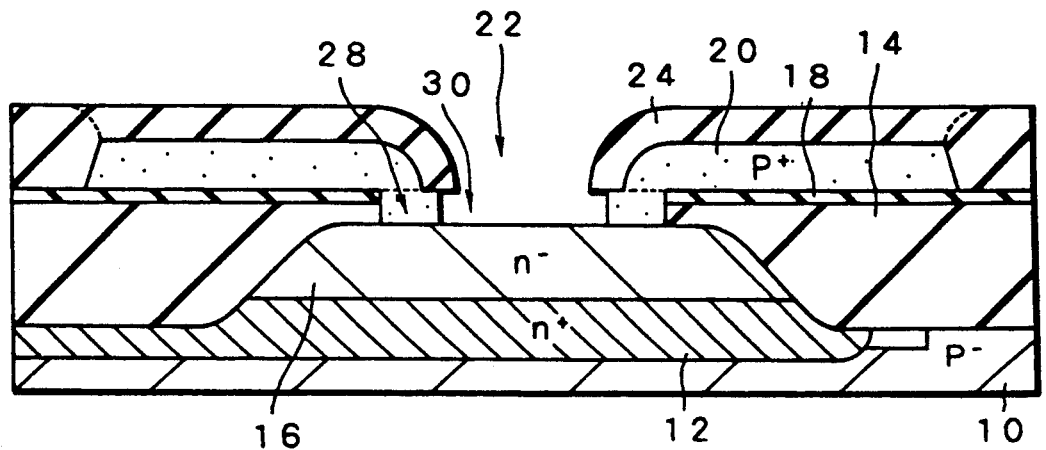
FIG_1 D
PRIOR ART
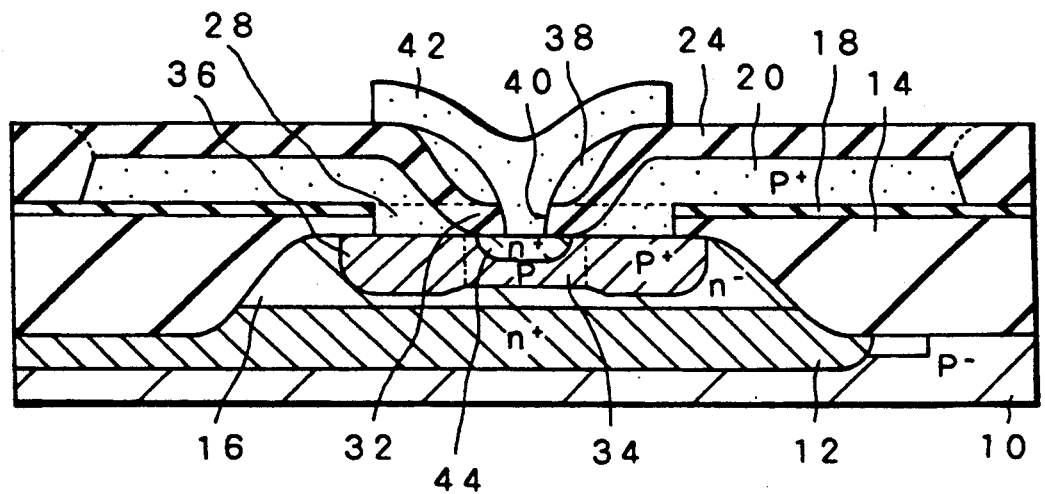

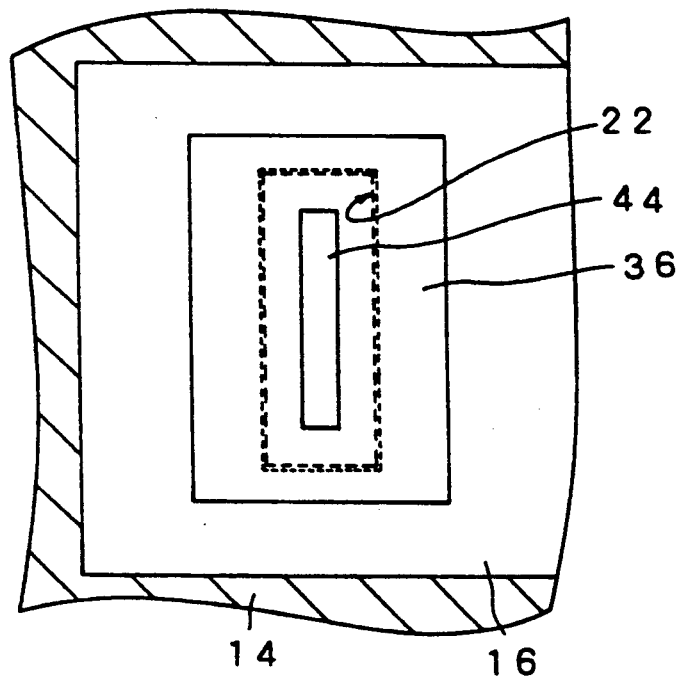
FIG_2
PRIOR ART

FIG_3 A
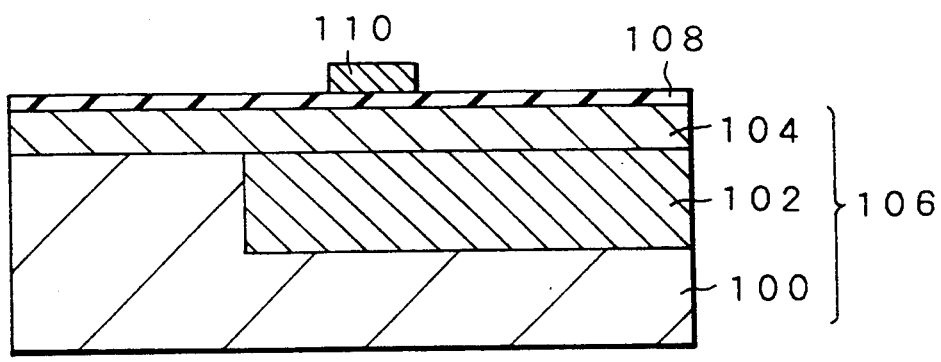
FIG_3 B
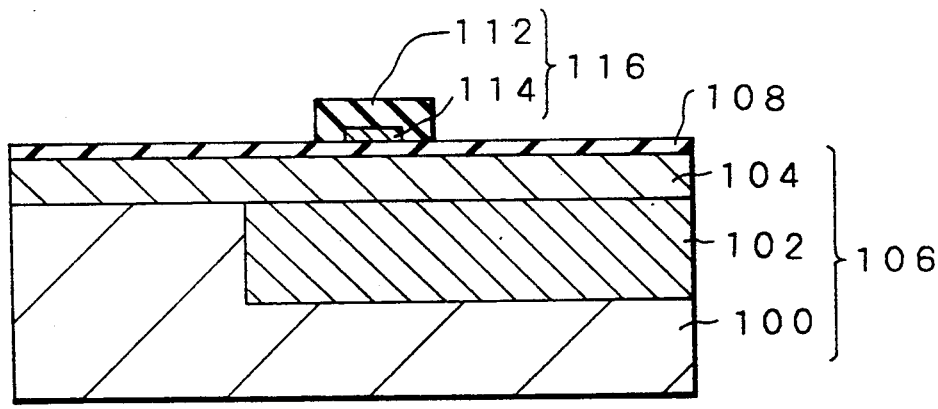
FIG_3 C
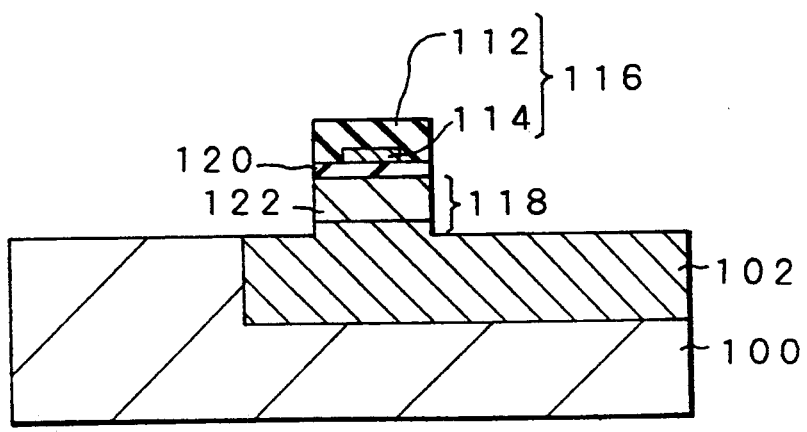

FIG_3 D
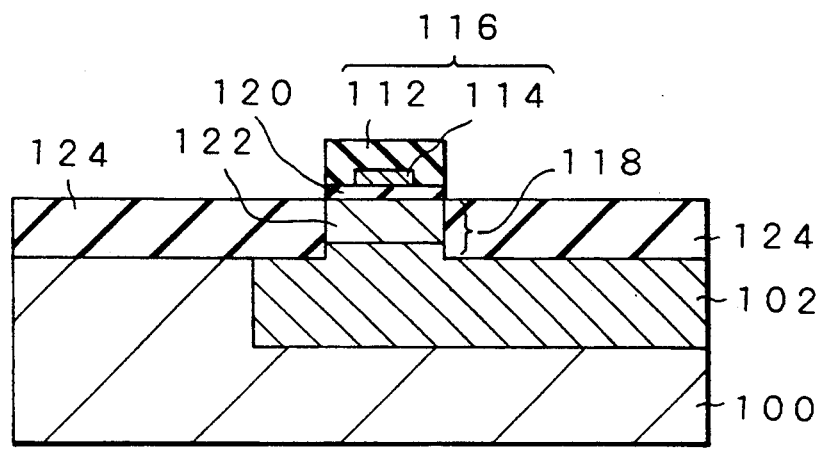
FIG_3 E
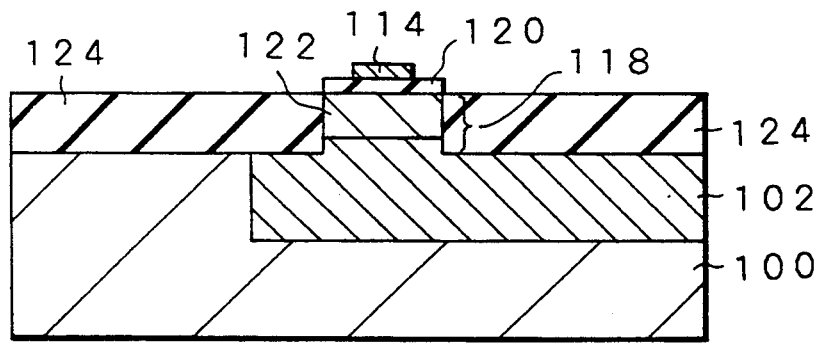
FIG_3 F
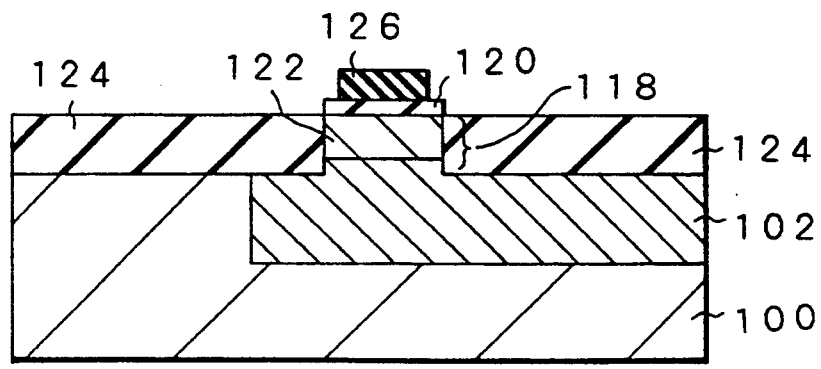

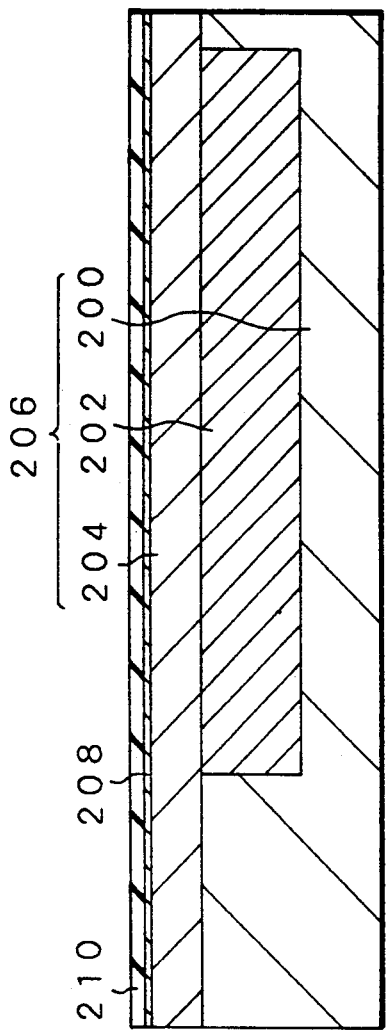
FIG_5 A
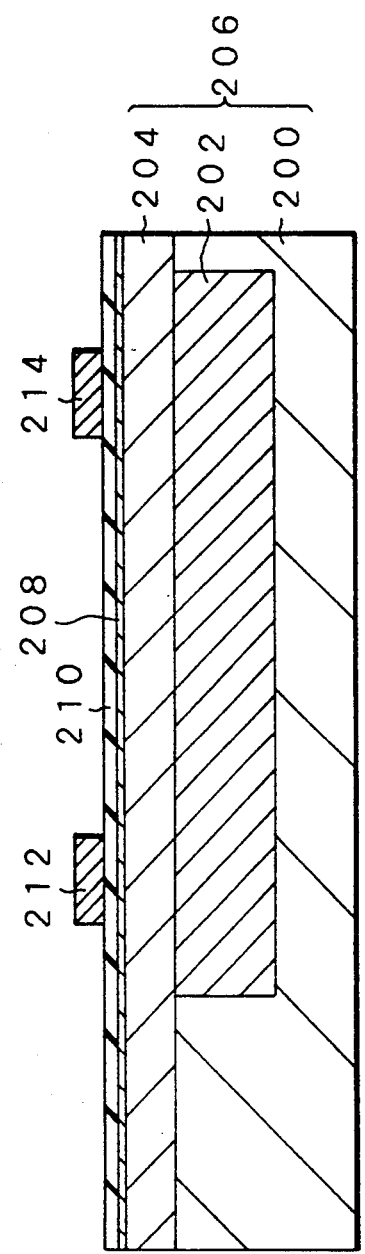
FIG_5 B

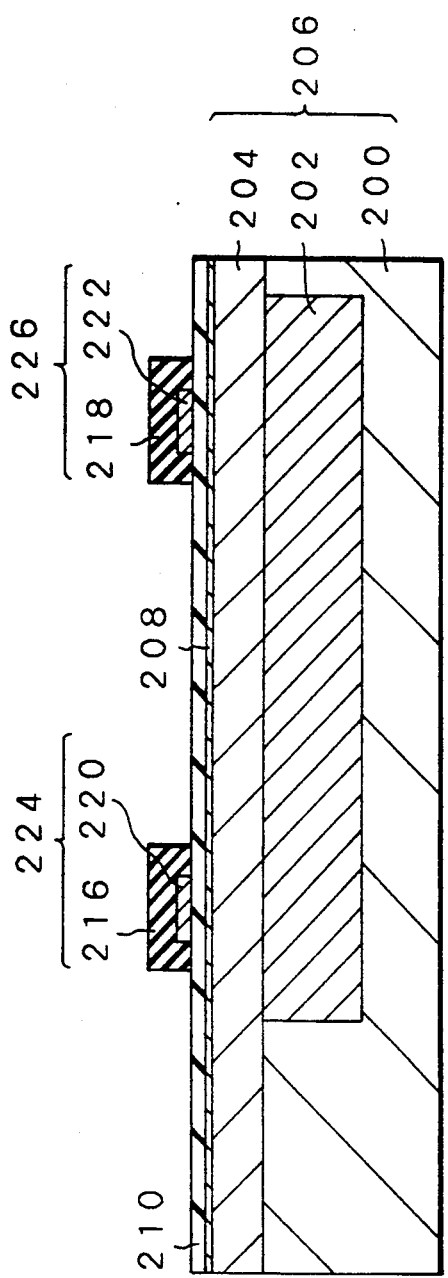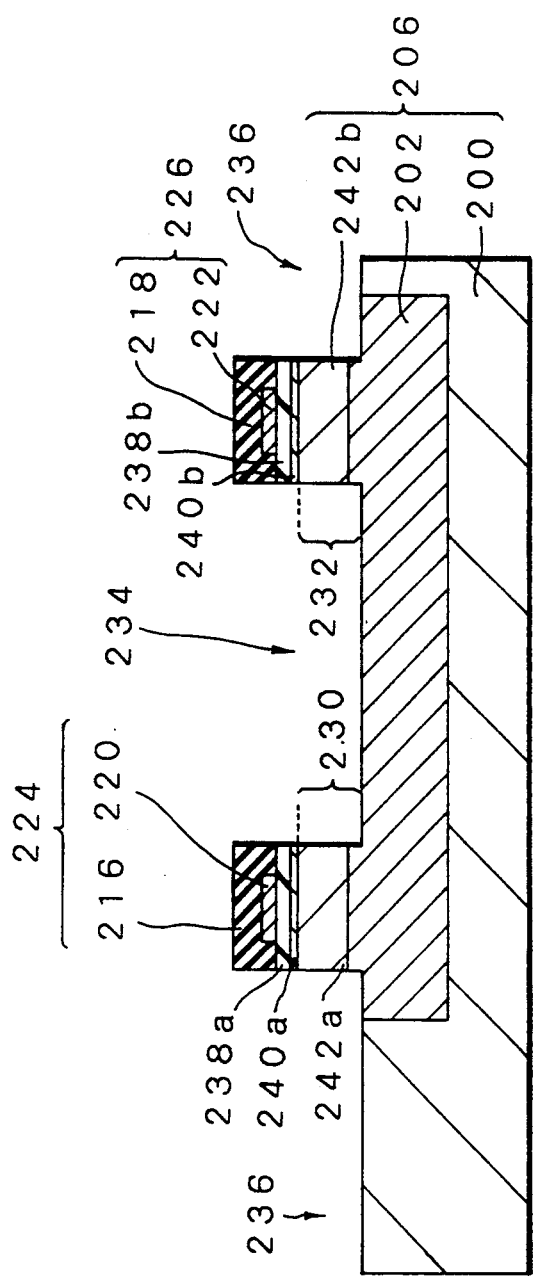
FIG_5C
FIG_5D

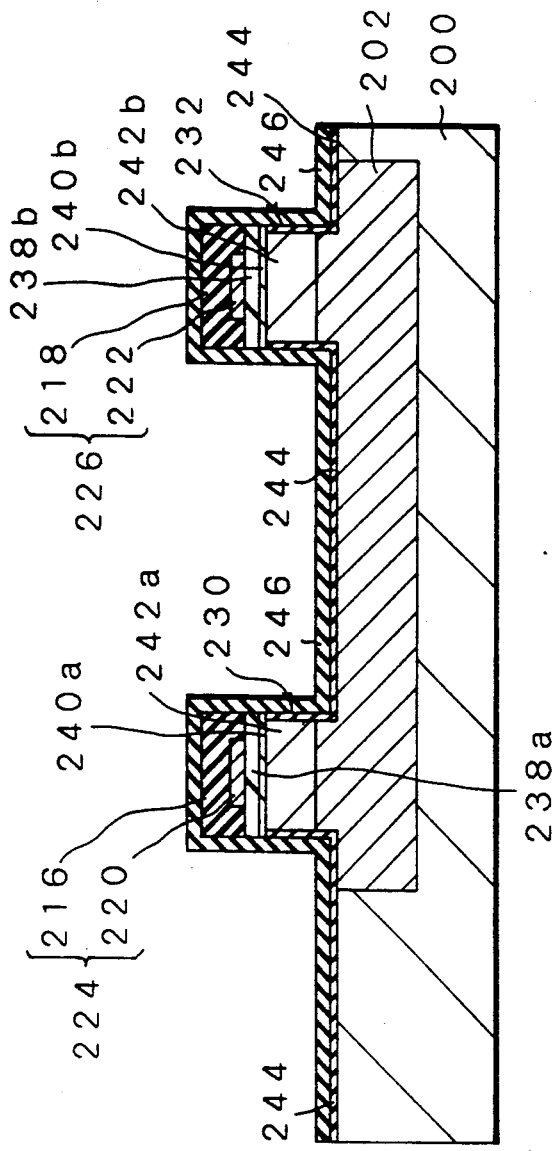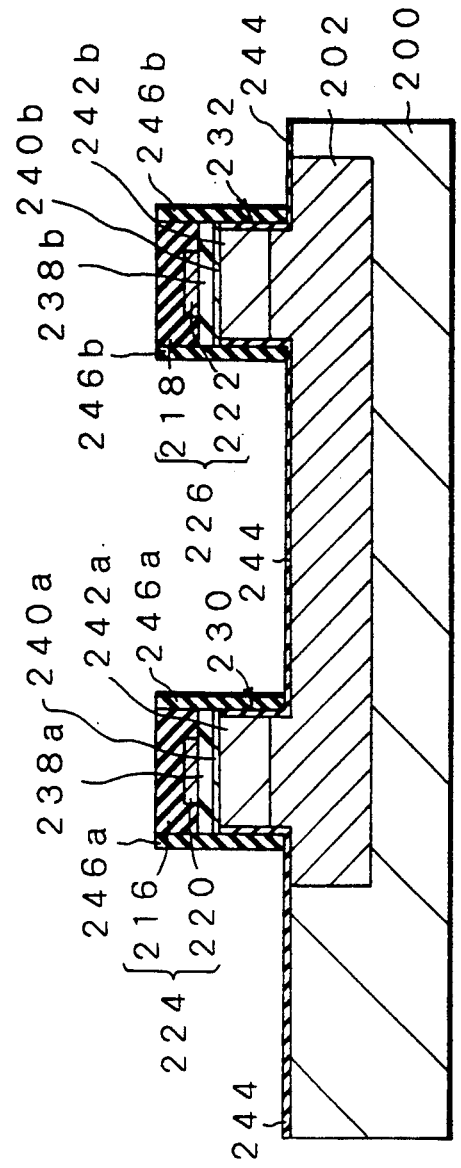
FIG._5E    FIG._5F

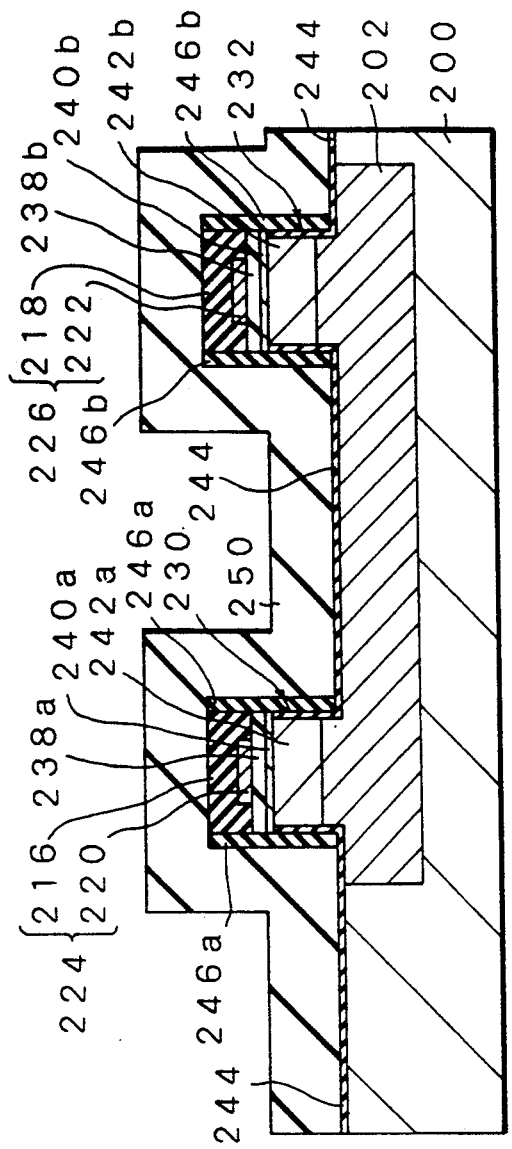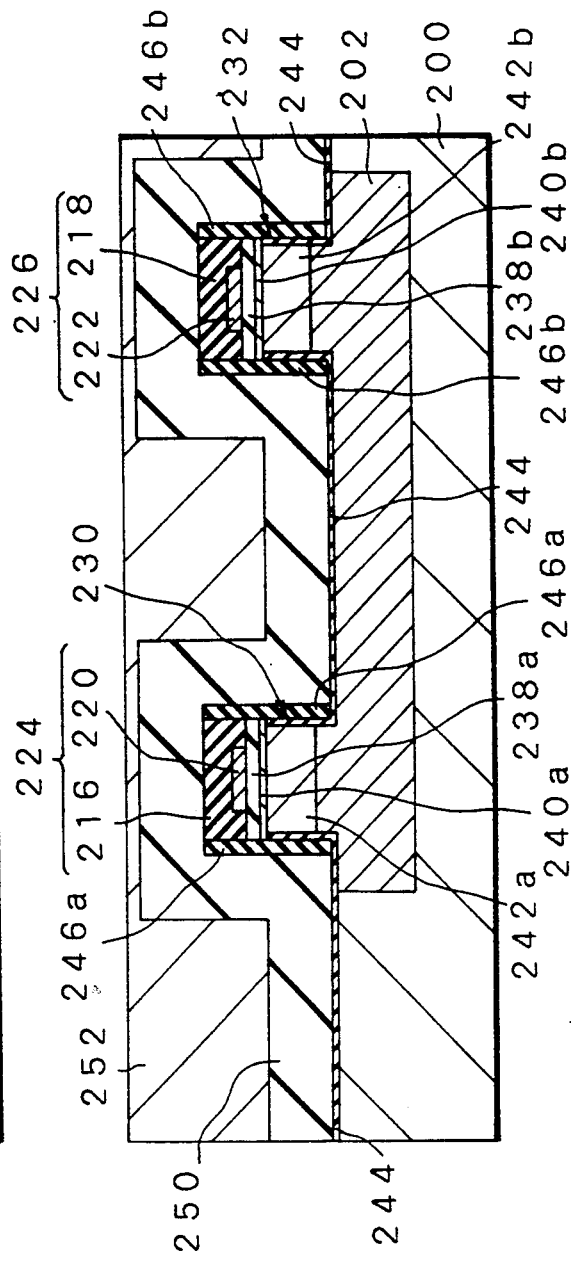
FIG_5 G
FIG_5 H

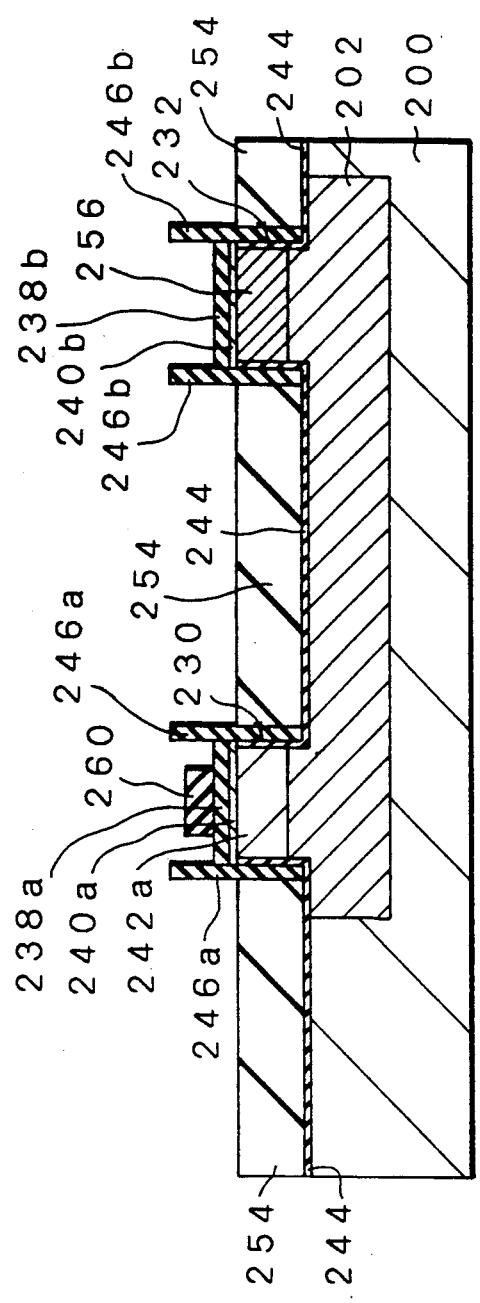
FIG_5 K
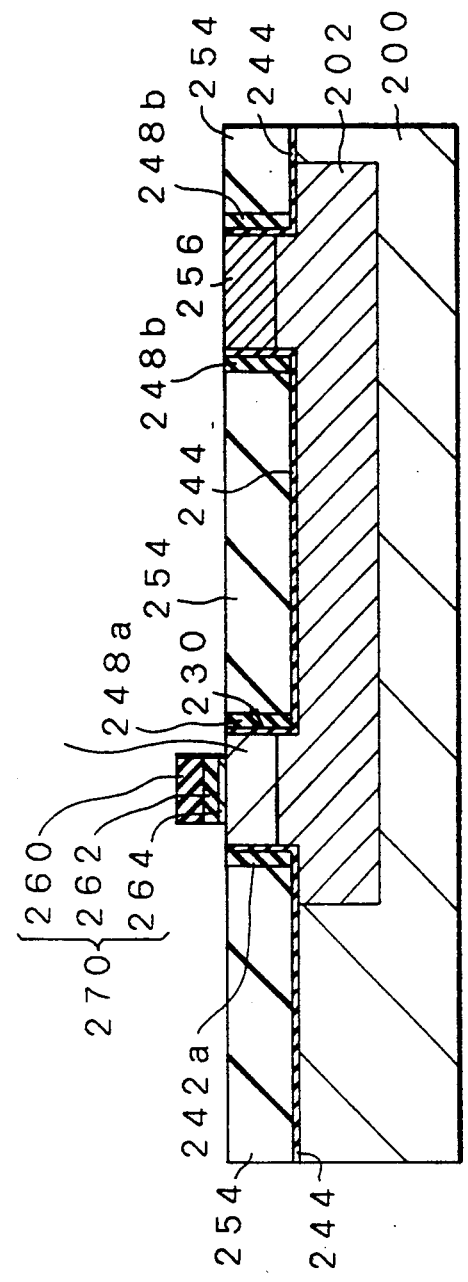
FIG_5 L

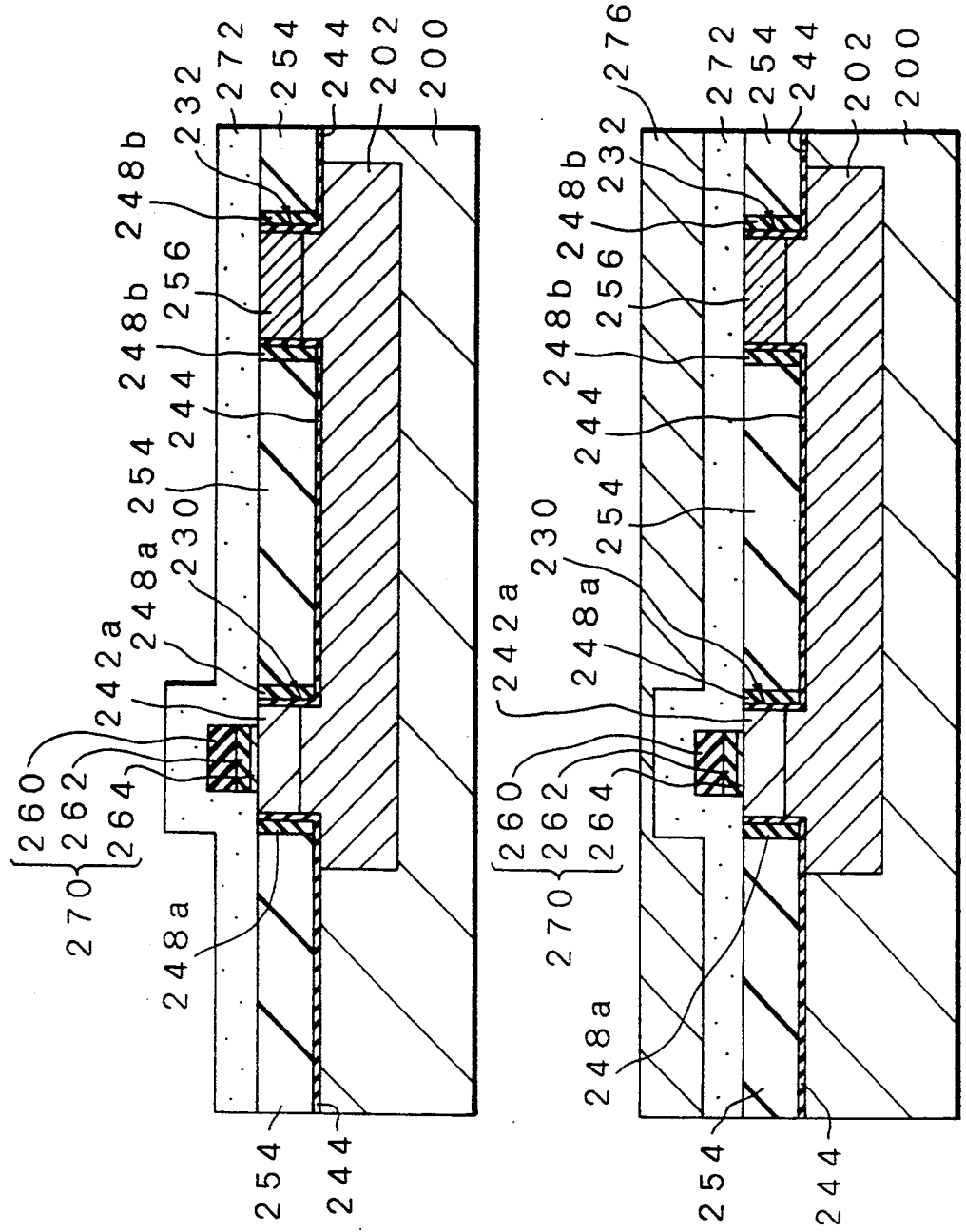

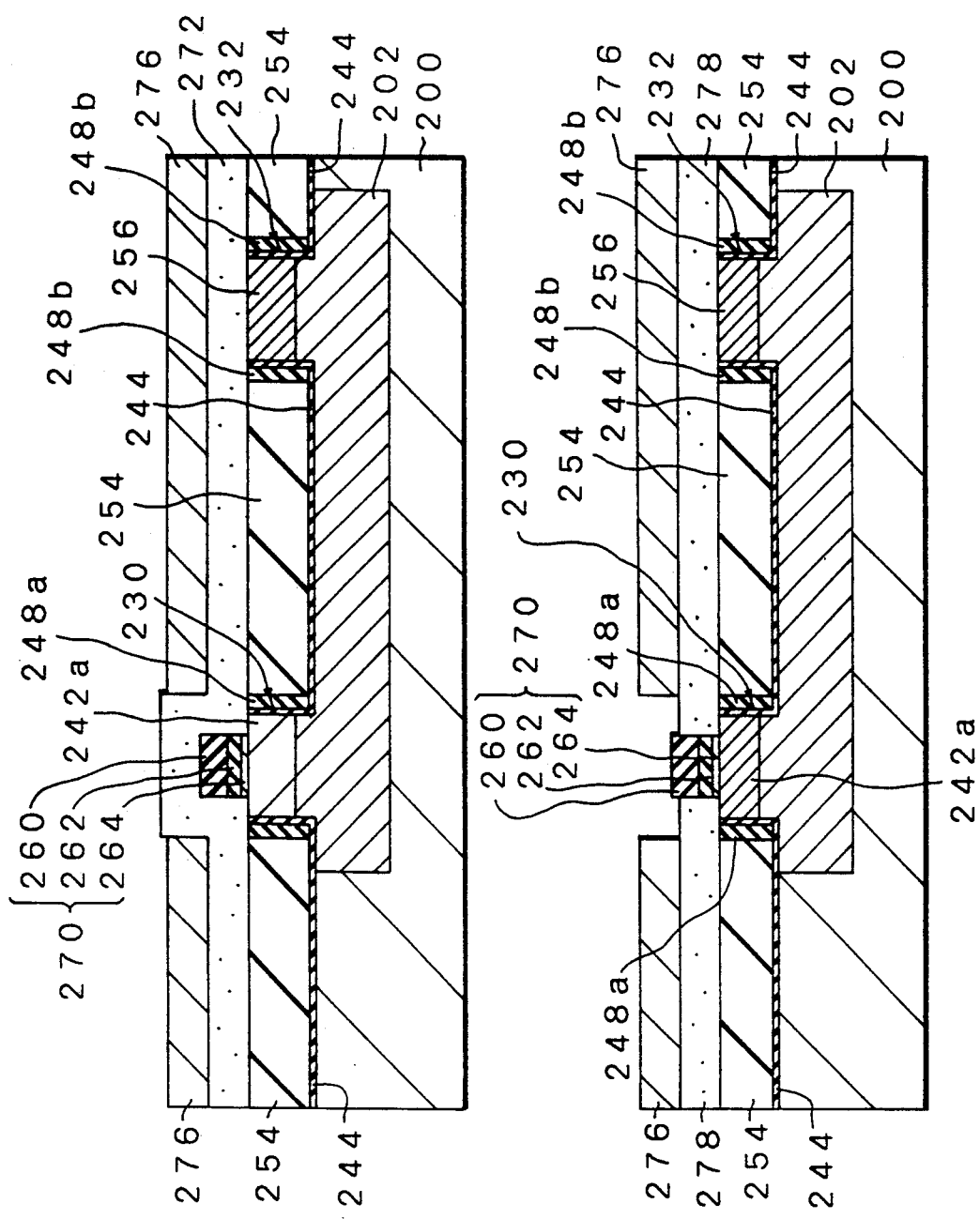

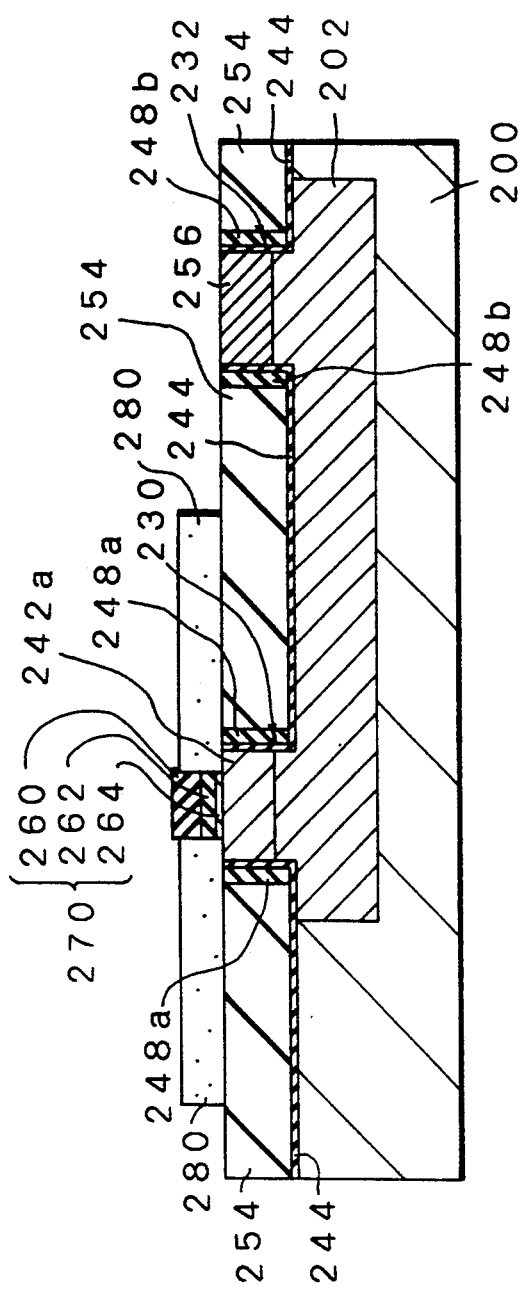
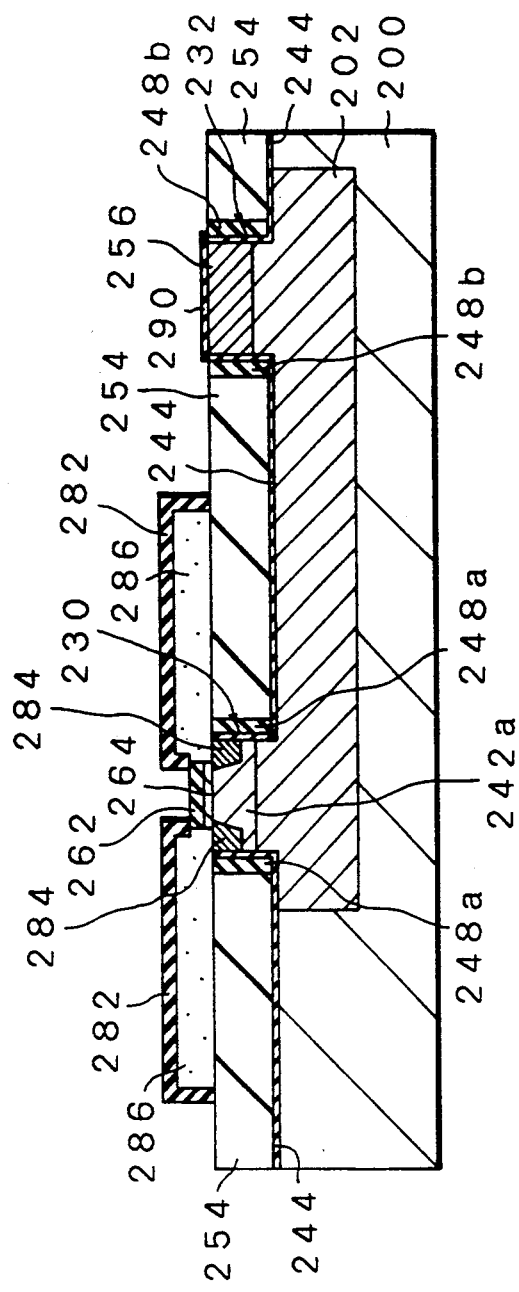
FIG. 5 Q
FIG. 5 R

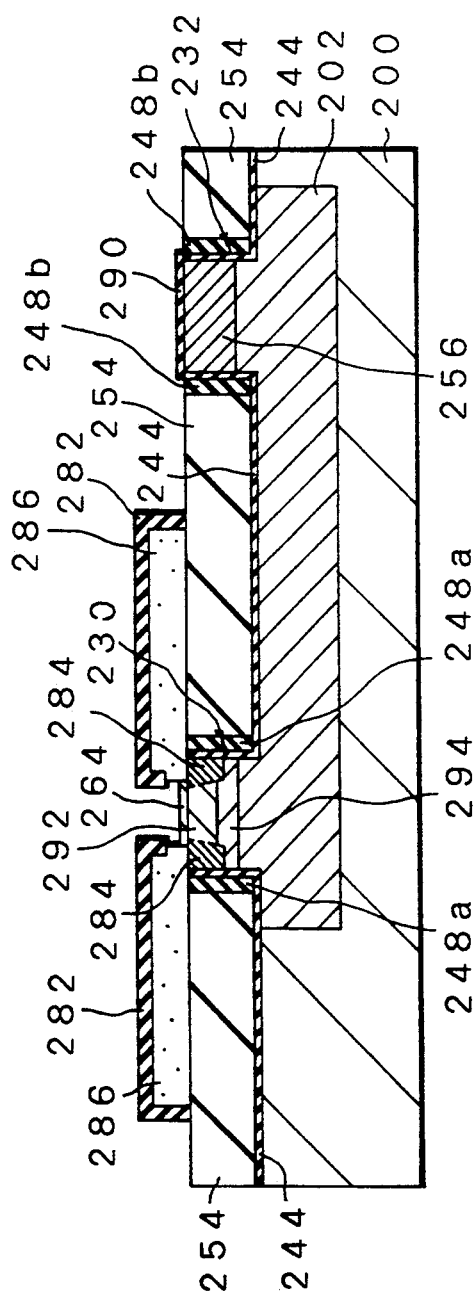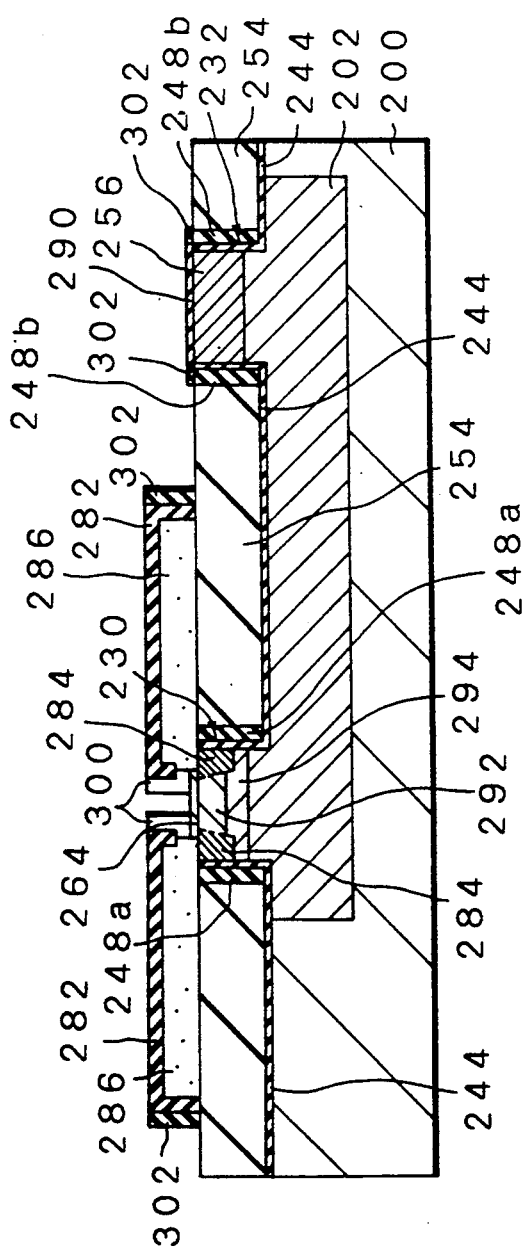
FIG_5 S
FIG_5 T

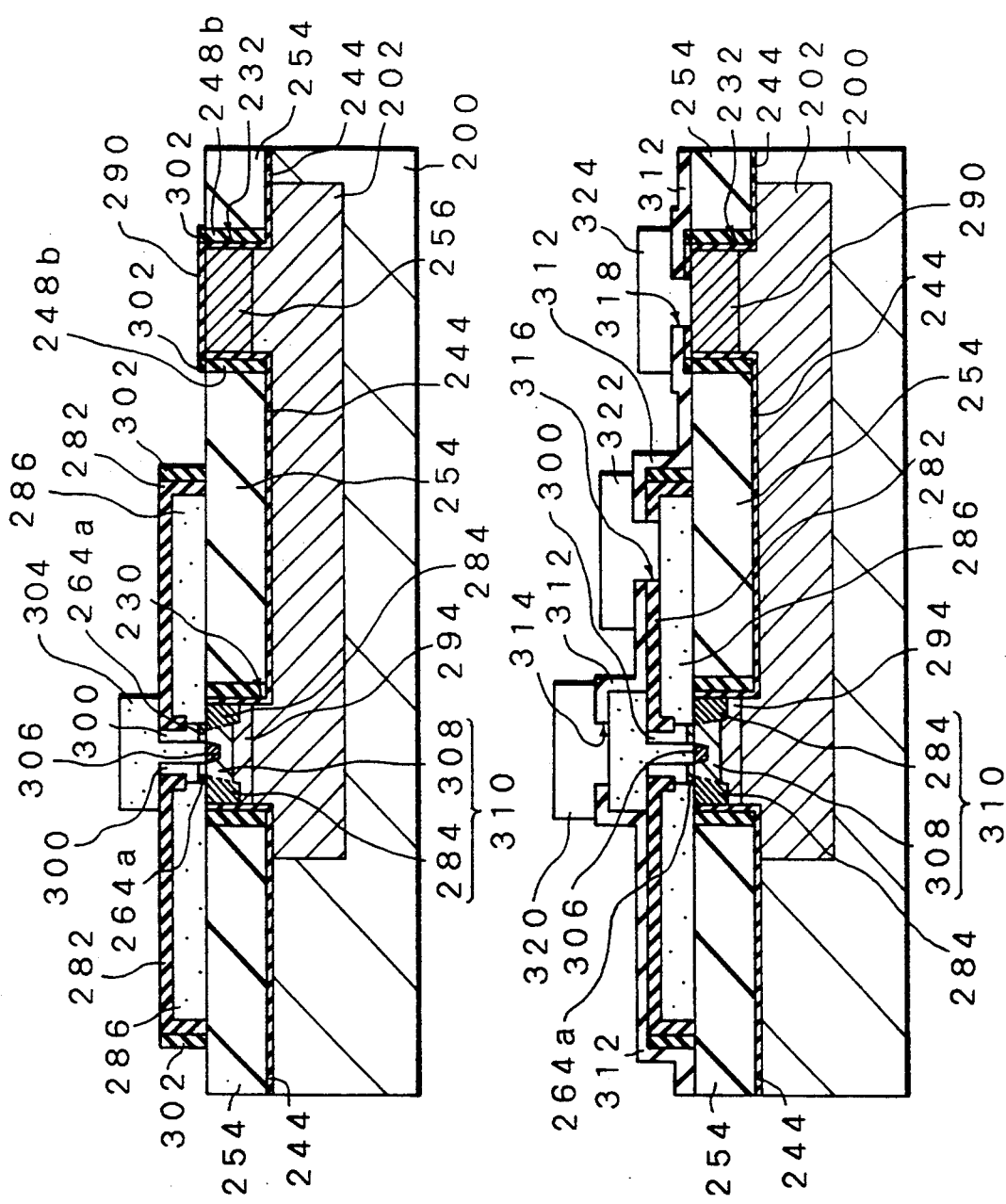
FIG_5U    FIG_5V

PROCESS FOR PRODUCING SEMICONDUCTOR DEVICE

FIELD OF THE INVENTION

The present invention relates to a process for producing a semiconductor device having a low power consuming characteristic and also enabling to operate at a high speed, in particular, to a process for producing the semiconductor device of a vertical type suitable for constructing an integrated circuit of semiconductor devices.

DESCRIPTION OF CONVENTIONAL TECHNIQUE

It is preferable to restrict the area(s) of a wafer in which respective elements such as transistor and the like occupy in order to obtain an integrated circuit (IC) of a high integration or compactness.

In addition thereto, in order to make bipolar type transistors constructing an IC operate at a high speed, it is necessary to attain following three points. That is, a gain band width product $f_T$ should be increased, a base resistance $r_b$ should be decreased and a base-collector junction capacitance $C_{TC}$ should be decreased.

To increase a gain band width product $f_T$, it is effective to decrease the thickness of an epitaxial layer, the depth from the surface of the epitaxial layer to a base junction and the depth of an emitter junction, to thereby reduce in a vertical direction the structure of transistor devices.

In order to decrease a base resistance $r_b$, it is necessary to put an inactive base with a high impurity concentration close to an emitter, as well as to make the width of the emitter narrower to form an emitter region of a narrow long shape.

The gain band width product $f_T$ and the base resistance $r_b$ are factors greatly contributing to attain the high speed operation of the transistor device, in particular, in the operative zone at large current.

While, decrease of the base-collector junction capacitance considerably contributes to attain the high speed operation of the transistor device, in particular in the operative zone at small current. In other words, it greatly contributes to make a consuming power low. It is necessary to decrease of an area of a base region in order to decrease the base-collector junction capacitance $C_{TC}$.

In order to attain the three points above, many manufacturing process of the semiconductor device using a self-align technology or a self-alignment technique have been proposed, for example, that disclosed in Japanese Patent Laid-open No. 62-216264. The following document discloses a typical manufacturing process using an improved technique of self-align: Extended Abstract of the 16th Conference on Solid Devices and Materials. KOBE; 1984 pp209-212.

FIGS. 1A-1D, show processing steps of silicon bipolar IC depicted in FIG. 3 of the above document. Respective drawings are shown in section.

Next, in order to clarify the differences between the conventional process for producing semiconductor devices and the present invention, the conventional process will be explained with reference to the document above.

First, in order to obtain the structure shown in FIG. 1A, an n+ type collector buried layer 12 is formed on a p− type silicon substrate 10. On the buried layer 12, an epitaxial growth of the silicon is done. An selective oxide film ($SiO_2$) 14 is formed in the epitaxial layer by means of a LOCOS method so as to isolate these elements from each other and simultaneously to form an n− type silicon layer (that is, an active region) 16 for mainly collectors.

Then, after the top surface of the selective oxide film is flatten or made plane, a silicon nitride film ($Si_3N_4$) 18 on the whole top surface of the film and then a p+ type first polycrystalline silicon layer for a base electrode is formed thereon.

According to the conventional technique, the first polycrystalline silicon layer is selectively etched by a photolithographical patterning while using a single mask to provide a hole 22 in the layer above a transistor forming region of an n− type silicon layer 16, thereby obtaining a polycrystalline silicon pattern 20 for a base electrode. In addition, at the bottom of the hole 22, a silicon nitride film 18 is exposed (FIG. 1A).

In order to obtain the structure shown in FIG. 1B, a silicon oxide film 24 is formed on the top surface of the polycrystalline silicon layer pattern 20. After that, using the silicon oxide film 24 as a mask, the exposed silicon nitride film 18 is wet etched. Owing to the wet etching, even the portion of the silicon nitride film 18 extended under the first polycrystalline silicon layer pattern 20 is removed by a side etch, thereby forming a space 26a in the area of the portion.

When the exposed portion of the selectively oxidized film 14 is removed, a part of the n− type silicon layer 16 is exposed to a hole 26 as shown in FIG. 1B.

In the next step for obtaining the structure shown in FIG. 1C, a LPCVD method is done to the structure shown in FIG. 1B. Thus, the second polycrystalline silicon layer is once formed so as to fill a space of the hole 26 under the polycrystalline silicon layer pattern 20. Then, a part of the second polycrystalline silicon layer exposed to the hole 22 is removed and a portion 28 of the second polycrystalline silicon layer is remained under the first polycrystalline silicon layer pattern 20. This remaining portion 28 is used as a base contact portion. Consequently, the first polycrystalline silicon layer pattern 20 for a base electrode comes to contact with the n− type silicon layer 16 through the polycrystalline silicon of the base contact portion 28. A hole surrounded by the base contact portion 28 has a reference number 30.

Next, in order to obtain the structure as shown in FIG. 1D, a silicon oxide film 32 is formed on a sidewall made of polycrystalline silicon of the base contact portion 28 and the n+ type silicon layer 16 by means of a thermal oxidation. A boron ion implantation or dosing into the n− type silicon layer 16 through the silicon oxide film 32 forms a p type active base region 34 in the silicon layer 16.

During the thermal oxidation treatment, impurity is diffused from the polycrystalline silicon of the base contact portion 28 into the n− type silicon layer 16, thereby forming a p+ type inactive base region 36 around the active base region 34.

After that, a sidewall layer 38 of a polycrystalline silicon is formed. Using the sidewall layer 38 as a mask, an emitter hole 40 is formed in the silicon oxide film 32 by an anisotropic dry etching and the hole 40 is filled by an n+ type polycrystalline silicon layer 42 containing As at a high concentration. Then, As (arsenic) is diffused from the n+ type polycrystalline silicon layer 42 to the active base region 34 in order to form an n+ type emitter region 44 in the upper portion in the p type base region 34. After that, the n+ type polycrystalline silicon layer 42 comes under a patterning and is used as an emitter electrode as shown in FIG. 1D.

FIG. 2 is a diagram showing a plane positional relation among an emitter region 44, base regions 34, 36, an active region 16, a separation region 14 and a hole 22 (shown by broken lines). In the drawing, the active base region 36 is shown by broken lines.

According to the conventional processing for producing a semiconductor device, the first polycrystalline silicon layer pattern 20 shown in FIG. 1A is formed by a photolithographic patterning using only a single mask (not shown), then an active base region 34, an inactive base region 36 and an emitter region 44, respectively are formed by a self align technique.

That is, the active base region 34 is formed in self-alignment with the hole 22 formed in the first polycrystalline silicon layer pattern 20. An inactive base region 28 is formed in self-alignment with the space 26a that extends under the first polycrystalline silicon layer pattern 20 and that is formed by the etching of silicon nitride film 18 and the selective oxide film 14. Also, the emitter region 44 is formed in self-alignment with the hole 40 with the hold 22.

According to the document above, the conventional process for producing a semiconductor device enables to obtain a delay time of 50 PS/gate of the LCML (Low Current Mode Logic) gate at a consumption current of 1.46 mW/gate.

According to the conventional process, using a mask pattern having the minimum line width advantageously enables to from an emitter region having a width narrower than the minimum width, and an inactive base region separated from the emitter region as short in distance as possible within a limit of necessity.

However, according to the conventional process, viewing the top surface of the substrate 10 from above, the inactive base region 36 is formed surrounding the hole 22 defined by the first polycrystalline silicon layer pattern 20. The base region is formed by the inactive base region 36 and the active base region 34, so that in the case that the minimum line width is 1 μm, real base region width expands to about 2.0 μm due to the lateral diffusion of impurity into the epitaxial layer 16.

As is already explained, above the area of the active region 16 in the previously formed isolation region 14, a hole 22 is formed in the first polycrystalline silicon layer by a photolithographic technique (FIG. 2). However, because the lateral expansion of the base regions 34 and 36, it is necessary to leave a margin or space for mask alignment between both regions 14 and 22. Consequently, it has been needed to previously form a wide active region 16. Due to the fact, a minimization of the transistor occupation area is limited and, in particular, the area of the collector region in the substrate becomes large when viewing it in plane. Correspondingly, the area of the n+ buried region 12 becomes large, so that it has been difficult to decrease a parasitic capacitance $C_{TS}$ between a collector and a substrate, resulting in a limit to a high speed operation of the transistor.

In addition, it is well-known that the area size of the base region occupying the substrate exerts great influence over the operating characteristic of transistors. As described above, according to the conventional process for producing a transistor device, an area occupied by the base region is determined by a side etching volume of the silicon nitride film 14. However, due to poor in controllability and reproducibility of the side etching, characteristics of the transistor every transistor or production lot have disadvantageously disperse.

Further, it has been disadvantage to carry out necessary twice mask alignment process of the one for forming the isolation region 14 on the n+ buried area 12 and the other for forming the hole 22 relative to the isolation region 14.

SUMMARY OF THE INVENTION

An object of the present invention is to provide a process for producing a semiconductor device(s) enabling to form field regions or areas and respective active regions by using a single mask alignment (or matching) process and a self-alignment technique(s) thereafter.

Another object of the present invention resides in a provision of a process for producing a semiconductor device(s), which process being carried out without any margin of the substrate adapted to be used in a mask matching or alignment relative to the field regions, resulting in a decrease of the area of the foundation to be occupied by a transistor.

Still another object is to provide a process for producing a semiconductor device(s) enabling to operate at a high operation speed.

Still another object is to provide a process for producing a semiconductor device(s) which is excellent in a controllability and a reproducibility of the process.

According to one aspect of the present invention for attaining the objects above, there is provided a process for producing a semiconductor device having therein first and second principal electrode regions as well as a control electrode region, comprising the steps of:

(a) forming a patterned structure on a top surface of a monocrystalline or single crystal silicon foundation through an oxidation-resistant film, the patterned structure having an island-like portion of a first polycrystalline silicon and a first thermal oxide film on the island-like portion;

(b) forming a raised portion used to form respective electrode regions therein by utilizing etching effective a top surface of the oxidation-resistant film down to the foundation partially in thickness-wise direction thereof except for an area under the raised portion, while using the patterned structure as a mask;

(c) forming a first insulating region around the raised portion;

(d) changing the first polycrystalline silicon of the island-like portion to a second thermal oxide film by the thermal oxidation treatment after the first thermal oxide film is removed, said second thermal oxide film being existed in the condition in which the preripheral area of a remaining oxidation-resistant film surrounding the second thermal oxide film being exposed;

(e) removing the exposed peripheral area of the oxidation-resistant film in order to expose the peripheral area of the top surface of the raised portion;

(f) forming a second polycrystalline silicon pattern layer coming in contact with the exposed peripheral area of the top surface and extending from a side face of said second thermal oxide film and the remaining oxidation-resistant film onto the first insulating region, said second polycrystalline silicon pattern layer containing a first conductive type impurity at a high concentration, (g) carrying out a thermal treatment to the second polycrystalline silicon pattern layer after the second thermal oxide film is removed, in order to form a third thermal oxide film on the surface of the second polycrystalline silicon pattern layer and a remaining portion thereof to be used as a control electrode, during which thermal treatment the first conductive type impurity is thermally diffused from the second polycrystalline silicon pattern layer into the raised portion to form a low resistance region(s) therein;

(h) removing the remaining oxidation-resistant film to expose the top surface of the raised portion;

(i) doping an impurity of a first conductive type into the raised portion from the top surface thereof to form a doped region(s) in the raised portion;

(j) forming a sidewall layer of a second insulating film on the top surface of the raised portion and on a sideface of the control electrode and of the third thermal oxide film;

(k) forming a third polycrystalline silicon pattern layer on the exposed area of the top surface of the raised portion, the third polycrystalline silicon pattern layer containing a second conductive type impurity at a high concentration;

(l) thermally diffusing the second conductive type impurity from the third polycrystalline silicon pattern layer into the doped region(s) to form an impurity diffused region, thereby obtaining the impurity diffused region serving as the first principal electrode region, the low resistance region and the remaining portion of the doped region(s) serving as the control electrode region, and a remaining region of the raised portion under the control electrode region serving as the second principal electrode region.

According to the above-mentioned process of the present invention, for forming the patterned structure, first a basic pattern of the first polycrystalline silicon is formed by a photolithogarphical patterning while using a single mask. Then, the basic pattern is thermally oxidized to form the patterned structure and thereafter a protrusion or raised portion is formed of a foundation in a manner of self-alignment by using the patterned structure as a mask. Around the protrusion, the first insulating region is filled, so the area in which respective active regions of the transistor are formed is restricted active regions of the protrusion. Consequently, when the protrusion is formed by the semiconductor layer, a part of which is designed to form the second primary (or principal) electrode region, it is possible to sequentially form self-alignmently the control electrode region and the first primary (or principal) electrode region in the top surface area of the protrusion.

In forming the control electrode region, a contact region of the low resistance is formed by thermal diffusion of impurity into the protrusion and there is no fear of the lateral diffusing of the impurity over the boundary of the protrusion. Consequently, at the most the width of the control electrode region equals to the width of the protrusion.

As described above, in accordance with the present invention, it is possible that the basic pattern is formed with the use of a single mask alignment and that, subsequently, the field region and respective active regions are formed in a manner of self-alignment. After the determination of the width of the basic pattern, it is possible to determine the width of the patterned structure, as well as that of the projection or protrusion according to the design. As a result, the width of a base region used as an active region, in particular the control electrode region is also automatically decided. In consequence, if the width of the basic pattern is made of the minimum line width, the area of the foundation occupied by the active region such as the base region and other regions, becomes minimum. Accordingly, an area occupied by a transistor to be formed and the base-collector contact area become the smallest. It is accordingly possible to expect a high speed operation of the transistor.

Because the active regions are formed within the protrusion, the controllability and reproducibility of process for forming respective active regions are improved.

In producing the semiconductor device according to the process of present invention, it is preferable that the patterned structure is obtained via following substeps of:

forming a first polycrystalline silicon layer on the oxidation-resistant film;

subsequently forming an island-like portion of the first polycrystalline silicon by means of photoetching and anisotropic etching techniques applied to the first polycrystalline silicon layer; and subsequently thermally oxidizing the island-like portion of the first polycrystalline silicon at the surface portion thereof to change it into the first thermal oxide film.

It is preferable that, in the embodiment of the present invention, the first insulating region is obtained via following substeps of:

forming a first insulating film covering whole exposed surfaces of the raised portion and the foundation;

subsequently forming a planarizing film of resist material on the first insulating film; and subsequently etching back the planarizing film and the first insulating film from the top surface of the planarizing film down to the level with the top surface of the raised portion to obtain a remaining portion of the first insulating film as the first insulating region.

Further, it is preferable that in the embodiment of the present invention, the first insulating region is formed with a first CVD oxide film formed by a LPCVD method.

Further, it is preferable that in the embodiment of the present invention, the removal of the oxidation-resistant film is carried out by using some etching technique except for anisotropic etching technique.

Further, it is preferable that in the embodiment of the present invention, the second polycrystalline silicon pattern layer is formed via following substeps of:

forming an uniform-thickness film of said second polycrystalline silicon layer on the top surface of the structure obtained by the step (e); and p1 then patterning the second polycrystalline silicon layer.

Further, it is preferable that in the embodiment of the present invention, the second polycrystalline silicon layer is formed by a sputtering or a LPCVD technique.

Further, it is preferable that in the embodiment of the present invention, the first conductive type impurity is doped in the second polycrystalline silicon layer after a forming of the second polycrystalline silicon layer and before the patterning thereof.

Further, it is preferable that in the embodiment of the present invention, after the formation of the second polycrystalline silicon layer and before the patterning thereof, following substeps are carried out:
- doping the first conductive type impurity at a high concentration in the second polycrystalline silicon layer;
- then forming the planarizing film on the second polycrystalline silicon layer containing the impurity;
- subsequently etching the planarizing film using the top surface of the impurity containing portion of said second polycrystalline silicon layer above the raised portion as an etching stopper;
- subsequently selectively etching the impurity containing portion of said polycrystalline silicon layer and the second thermal oxide film from the exposed top surface of the impurity containing polycrystalline silicon layer portion down to the middle of the second thermal oxide film; and
- then removing the remaining portion of the planarizing film of the resist material.

Further, it is preferable that in the embodiment of the present invention, the sing crystal foundation is essentially composed of the first conductive type silicon substrate and a second conductive type epitaxial layer provided thereon.

Further, it is preferable that in the embodiment of the present invention, the silicon substrate has provided therein a second conductive type buried layer used as a portion extending from the second principal electrode region.

Further, it is preferable that in the embodiment of the present invention, the first conductive type is a p conductive type and the second conductive type is an n conductive type.

Further, it is preferable that in the embodiment of the present invention, the oxidation-resistant film is a nitride film.

Further, it is preferable that in the embodiment of the present invention, the first insulating film is a second CVD oxide film formed by a CVD method.

Further, it is preferable that in the embodiment of the present invention, the first and second insulating films are silicon oxide films.

Further, it is preferable that in the embodiment of the present invention, a buffer layer is formed on the top surface of the foundation and the oxidation-resistant film is formed on the buffer layer.

Further, it is preferable that in the embodiment of the present invention, further includes following substeps of:
- forming a buffer layer between the foundation and the oxidation-resistant film;
- forming a thin thermal oxide film, before the step (c) above, on a surface of the foundation and the sidewall of raised portion, respectively exposed by the etching of the step (b) above by means of a thermal oxidation;
- forming a third insulating film on the whole surface of the top surface of the structure having the thin thermal oxide film formed thereon; and
- carrying out an anisotropic etching along the direction perpendicular to the surface of the foundation to the third insulating film in order to form sideface protective film consisting of the remaining portion of the third insulating film at the sideface of the patterned structure and the raised portion.

Further, it is preferable that in the embodiment of the present invention, the third insulating film is a nitride film formed by a LPCVD technique.

Further, it is preferable that in the embodiment of the present invention, including following substeps of:
- forming a first insulating film of uniform thickness on the whole top surface of the structure having the sideface protective film formed thereon;
- forming a planarizing film of resist material on the insulating film;
- etching the first thermal oxide film and etching partially the first insulating film, while using the oxidation-resistant film as an etching stopper, to form the first insulating region by the remaining portion of the first insulating film; and
- then, removing partially the oxidation-resistant film, the buffer layer and the sideface protective film, respectively, while using the second thermal oxide film as a mask in the step (e) above.

According to another aspect of the present invention for attaining the above objects, a semiconductor device for constituting a part of an integrated circuit, which device having provided therein as active regions a first and second principal electrode regions and a control electrode region, respectively arranged along the direction of depth from the top surface of a foundation, comprising following steps of:
- forming an island-like portion of a polycrystalline silicon used as a standard defining the area occupied, when viewing top surface of the foundation, by respective active regions above the top surface of the foundation, by means of a photolithographical technique and an etching technique; and
- the substantial areas of the respective active regions are defined in a manner of self-alignment.

BRIEF DESCRIPTION OF THE DRAWINGS

The foregoing and other objects, features and advantages of the present invention will be better understood from the following description taken in connection with the accompanying drawings, in which:

FIG. 2 is a partial plan view schematically showing a positional arrangement of an emitter region, a base region, an active region, an isolation region and a hole;

PREFERRED EMBODIMENTS OF THE INVENTION

Figure 1:
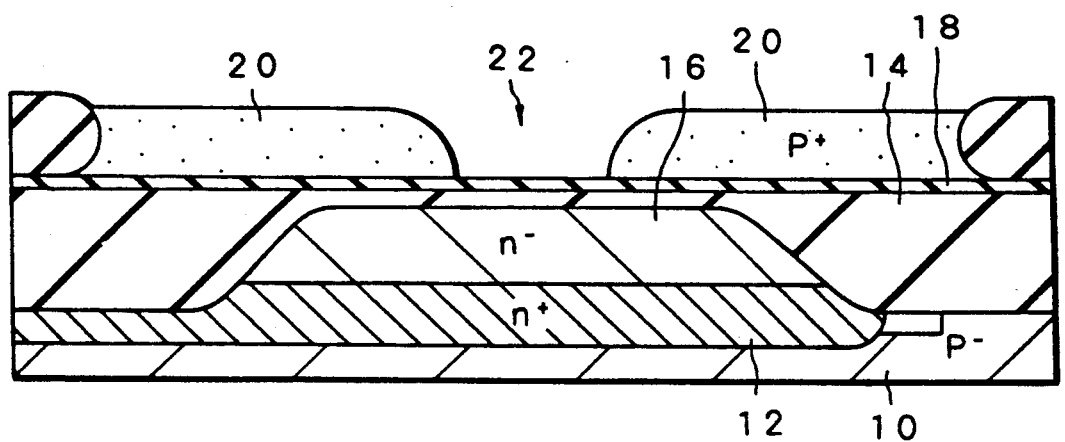
FIGS. 1A-1D are process diagrams illustrating a process for producing a semiconductor device according to the conventional technique.
Figure 1:
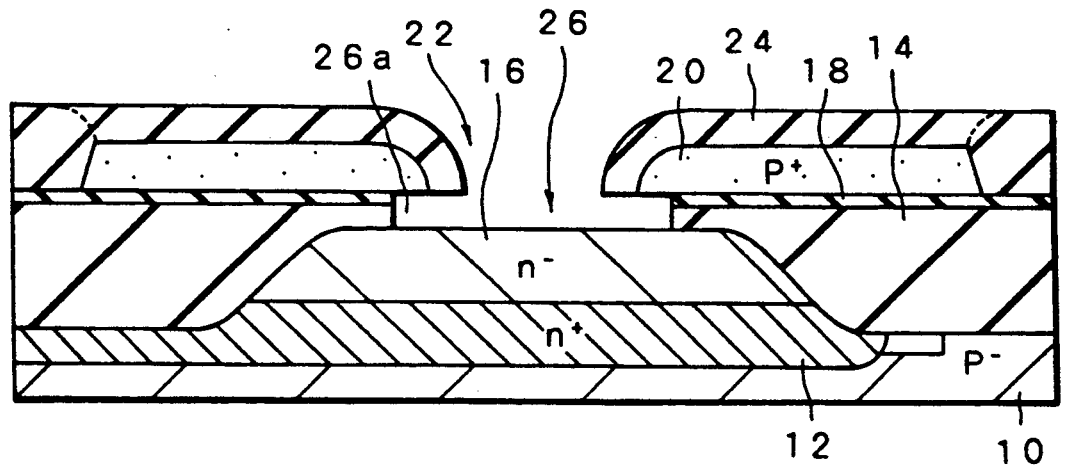

Some preferred embodiments of the invention will be explained with reference to the accompanying drawings. Anyway, the drawings show schematically the size, shape and the arrangement of various constitutional elements of the embodiments so as to be at least understood the gist of the invention. In addition, the embodiments described below are only example or preferred ones, so that it must be understood that the present invention is not restricted to the following embodiments.

In the description of the preferred embodiments, having an eye to only one of a number of elements or transistors constituting an integrated circuit (IC), a method for manufacturing the transistor will be explained.

FIGS. 3A-3J, respectively show steps for producing the transistor according to the preferred basic embodiment of the present invention and each depicts the structures in section obtained by the major processing steps.

First, a buried layer 102 of a second conduction type, for example, n+ type is formed in, for example, a silicon semiconductor substrate 100 of a first conduction type, that is, p type. A silicon epitaxial layer 104 of n− is formed on the whole area of the top surface of the substrate 100 so as to obtain a foundation or underlayer 106. Upon the top surface of the foundation 106, an oxidation-resistant film, for example, a nitride film 108 is formed. At a suitable position upper an area of the buried layer 102 and on the nitride film 108, a pattern of polycrystalline silicon layer is formed by means of a photolithographic technique as a basic pattern 110 of the minimum line width, for example, 1 μm. The structure formed by the step is shown in FIG. 3A. Preferably, the sideface of the basic pattern 110 extends substantially perpendicular to the top surface of the foundation 106.

Next, about 2/5 of a thickness of the basic pattern 110 is so thermally oxidized so as to form the first thermal oxide film 112. This first thermal oxide film 112 and an island portion 114 of polycrystalline portion remained of the basic pattern 110 constitute a patterned structure 116 as shown in FIG. 3B.

Then, using the patterned structure 116 as a mask, an anisotropic etching is carried out vertically on the top surface of the foundation 106 and an island protrusion or raised portion 118 is formed, thereby obtaining such structure as shown in FIG. 3C. The anisotropic etching effects to the depth of the buried layer 102 formed in the substrate 100 through the oxidation-resistant film 108 and the epitaxial layer 104. Here, the remained or residual oxidation-resistant film is shown by 120 and the remained or residual epitaxial layer by 122. Consequently, the island projection or raised portion 118 shown is constituted by a part of the buried layer 102 and the residual epitaxial layer 122.

For example, a LPCVD (Low Pressure Chemical Vapor Deposition) process forms a first dielectric film of an uniform thick on the whole upper surface of the structure shown in FIG. 3C. Preferably, the first dielectric or insulating film is, for example, a silicon oxide film or the like. Next, a planarizing film of a resist is formed on the top of the first dielectric film and an etch back is done from the surface of the planarizing film to the same level substantially as that of top surface of the raised portion 118. As a result of the etch back, a portion of the first dielectric film remained so as to surround or bury the periphery of the raised portion 118 becomes a first dielectric or insulating region 124 of a field region or isolating region. The structure having the first dielectric region 124 formed is shown in FIG. 3D. It is preferable to make etching rates of the resist for a etch back and of the first dielectric film substantially equal to each other and to halt or stop the etching process during the etch back at the instant of appearing the top surface of the raised portion 118 on the foundation 106.

Next, the first thermal oxide film 112 of the patterned structure 116 is removed using a suitable conventional process to expose the island portion 114 and the remained oxidation-resistant film 120, thereby obtaining the structure shown in FIG. 3E. After that, this island area 114 of polycrystalline silicon is thermally oxidized in order to change the whole of the island area 114 to the second thermal oxide film 126, obtaining the structure shown in FIG. 3F. In this case, viewing the structure from the upper side thereof, the second thermal oxide film 126 is placed in the area of the oxidation-resistant film 120 under the film 126 and a circumferential portion of the oxidation-resistant film 120 is exposed around the second thermal oxide film 126.

The circumferential portion of the oxidation-resistant film 120 is removed by using a suitable conventional technique so as to expose the circumferential top surface portion of the remaining epitaxial layer 122 of the raised portion 118, obtaining the structure shown in FIG. 3G. A portion of the oxidation-resistant film 120 remained after the etching is shown by 128.

The second pattern layer 130 of a polycrystalline silicon is formed around the second thermal oxide film 126 and the remaining or residual oxidation-resistant film 128 so as to contact with the circumferential surface portion of the top surface of the exposed raised portion 118, thus obtaining the structure shown in FIG. 3H. This second polycrystalline silicon pattern layer 130 constitutes a base or control electrode itself or an extending or lead-out portion thereof which is finally made. Consequently, it is preferable to decide the suitable length and width of the pattern layer 130 extending from the sides of the second oxide film 126 along the first dielectric region 124 according to its particular design. It is also preferable to make the pattern layer 130 of the first conductive type by containing p type impurity or dopant of a high concentration therein according to the embodiment.

Preferably, the second polycrystalline silicon pattern layer 130 is formed, for example, according to the following manner.

First, upon the whole top surface of the structure shown in FIG. 3G, a second polycrystalline layer of an uniform thickness is formed by means of a sputtering or LPCVD process. After the second polycrystalline layer is doped with p type dopant of a high concentration, once a planarizing film of a resist is formed on the second Si pattern layer and an etching back and selective etching are carried out on the surface of the planarizing film effective to the level of the second polycrystalline layer corresponding to the level in a middle of the whole thickness of the second thermal oxide film 126. The remaining or residual portion of the second polycrystalline silicon layer is patterned by a photolithographical technique to obtain the second polycrystalline silicon pattern layer 130.

Next, the second thermal oxide film 126 is removed from the structure shown in FIG 3H by a suitable method. And then, the surface portion of the second polycrystalline silicon pattern layer 130 is changed to a third thermal oxide film 132 by a thermal oxidation. A part of the second polycrystalline silicon pattern layer remained after the thermal oxidation serves as a control electrode 134 itself or an extending portion thereof. During the thermal oxidation above, p type dopant is thermally diffused from the second polycrystalline silicon pattern layer 130 to the second conductive type or n⁻ epitaxial layer 122 of the raised portion 118 of the foundation through contacting area therebetween, thereby obtaining a low resistance region 136 in the epitaxial layer 122. The low resistance region 136 is also called as a diffused layer or diffused region in which the thermally diffused impurities are included at high concentration. The resultant structure is shown in FIG. 3I. As is already described in the former, a dielectric or insulating region is formed around the raised portion 118, so thermal diffusion of impurity is restricted to inside the area of the raised portion 118 and accordingly any diffusion along transversal directions out of the area of the raised portion 118 is suppressed. As a result, viewing the top surface of the foundation from above, the limit line of outer most of the control electrode area or base area corresponds to boundary or profile of the raised portion 118.

Next, the remaining oxidation-resistant film 128 is removed with a suitable process to expose the top surface of the raised portion 118 or, accordingly, of the epitaxial layer 122. Successively, dopant of the first conductive type or, in this case, p type is doped into the exposed top surface of the epitaxial layer 122 in depth so as to form a doped region or an impurity-containing region 138. The doped region 138 is formed by, for example, an impurity implantation technique and will be activated at a suitable stage of the manufacturing. After forming this doped region 138 and the low resistance region 136, a portion of the epitaxial layer remained under these regions becomes the second principal electrode region 134, for example, a collector electrode region as shown in FIG. 3J. Furthermore, the portion of the control electrode contacting with the second thermal oxide film is formed in self-alignment manner.

When the second thermal oxide film and the oxidation-resistant film are removed, a groove or hole 144 is obtained, so that side surfaces of the third thermal oxide film 132 and of the control electrode 134, respectively above the raised portion 122 are exposed. Consequently, it is necessary to apply a sidewall layer(s) 146 to the side surfaces of the control electrode 134 and of the third thermal oxide film 132 by means of an appropriate conventional method as shown in FIG. 3K. The purpose of the sidewall layer 146 is to electrically isolate both the control electrode 134 and the third thermal oxide film 132 from a first principal electrode (an emitter electrode in this embodiment) which will be formed later. The sidewall layer 146 is formed by a second dielectric or insulating film having a good insulating characteristic. The sidewall layer 146 defines a groove or hole 145 as shown in FIG. 3K.

Next, upon the exposed top surface of the doped region 138 of the structure shown in FIG. 3K, a third polycrystalline silicon pattern layer 148 is placed or formed so as to fill the groove or hole 145 by a conventional ordinal process. This third polycrystalline silicon pattern layer 148 is formed as a layer containing therein dopant of the second conductive type (here, it is n type) of a high concentration. Continuously, the dopant of the second conductive type is thermally diffused from the third polycrystalline silicon pattern layer 148 to within the doped region 138 in order to form an impurity diffused region 150 in the region 138 above. A portion of the impurity diffused region remained after forming the impurity diffused region 150 is an active control electrode region 152. This active region 152 is connected to the low resistance region 136 and forms together therewith a control electrode region or a base region 154. The impurity diffused region 150 constitutes a first principal electrode region or, accordingly, an emitter electrode region.

These first and second principal electrode regions 140 and 150, and the control electrode 154 are formed as described above. After that, an appropriate dielectric or insulating layer 160 and others are formed according to one of the conventional processes, and then, a contact hole(s) is formed at a necessary place(s) and a metal wiring(s) or interconnection(s) 162 is formed in the contact hole(s) as shown in FIG. 3L. In FIG 3L, the third principal electrode is now shown.

According to the basic embodiment, the raised portion 118 of the foundation 106 is formed in a manner of self-alignment using the patterned structure 116 shown in FIG. 3B. In an epitaxial layer in the raised portion 118, each active region or area 140, 154 and 150 of a collector, base and emitter are formed. The low resistance contact region 136 of the base region 154 is formed in self-alignment with the second thermal oxide film 126 formed on the top surface of the raised portion 118. The impurity containing region 138 used as the active base region 152 is formed self-alignmently with the sidewall portions of the control electrode 134 and the third thermal oxide film 132 on the top surface of the electrode 134 above the raised portion 118. The impurity diffused region 150 used as an emitter region is formed self-alignmently with the sidewall layer 146. A patterned structure 116 used as a mask for forming the raised portion 118 is formed by a making of a basic pattern 110 of the minimum line width through a single mask alignment using a mask and a thermal oxidation of the part of the basic pattern 110 after the following formation thereof. Furthermore, at least a portion(s) of the second pattern layer 130 on the protrusion 118 are formed in a self-alignment manner with respect to the sidewalls of the second thermal oxide film 126 and residual oxidation-resistant film 128.

Figure 4:
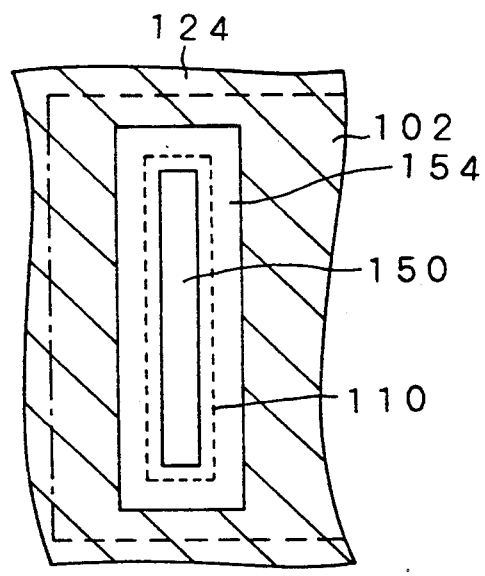
FIG. 4 is a partial plane view schematically showing a positional arrangement of a field oxide film, a buried layer, a base region, an emitter region and a basic pattern.

FIG. 4 is a top view of the top surface of the foundation of the transistor showing the positional relation among the field oxide film 124 (hatching), the buried layer 102 (its boundary is shown by broken lines), a base region or the control electrode region 154, an emitter region or the first principal electrode region 150 and the basic pattern 110 (shown by a doped line).

The size of the emitter region 150 of the present invention shown in FIG. 4 is identical to as shown the size of the conventional emitter region 44 shown in FIG. 2, so it is understood from both the figures that the occupied area of the base region 154, the buried layer 102 and an active region (in FIG. 4 , it is identical to the base region), respectively formed in the transistor formed according to the present invention in the transistor formed according to the present invention can miniaturize than that of the conventional transistor. Consequently, because the area occupied by a single transistor of the present invention is very small, it is possible to attain a high integration in producing ICs according to the present invention. In addition, the contacting areas between a base and a collector and also the contacting area between the collector and a substrate are miniaturize, it is possible to a make an operation speed of the transistor more high one. According to the process for producing semiconductor devices, all active regions or areas of the transistor is contained in the raised portion and any impurity diffusion in lateral directions which is not necessary is restricted, so that it is said that the process above has a good controllability and reproducibility.

Another preferred embodiment of the semiconductor device according to the present invention will be explained. In an explanation of the embodiment, similar to the case of the basic embodiment, a single transistor constituting a constituent of an IC will be picked up. The process of forming the structure containing the first and the second principal electrode regions and a control electrode region as well as the second principal electrode for the second principal electrode region will be explained. In the embodiment, the first principal electrode is an emitter electrode, the second principal electrode is a collector electrode and the control electrode is a base electrode, and further, the first conductive type is p type and the second conductive type is n type.

FIGS. 5A to 5V are processing steps used to the explanation of the embodiment of the semiconductor device producing method and each figure shows sections of the structure obtained by the steps.

First, upon the p− type silicon substrate 200 (hereinafter referred to as a substrate), an n+ type buried diffusion layer 202 is formed. On the whole surface of the substrate 200, an n− type silicon epitaxial layer 204 is formed to obtain a foundation 206. The epitaxial layer 204 has a thickness of about 1 μm. After this, on the top surface of the epitaxial layer 204, an oxide buffer film 208 and a first nitride film 210 of an oxidation-resistant film are formed one over the other, thereby obtaining the structure shown in FIG. 5A.

Next, on the whole top surface of the first nitride film 210, a first polycrystalline silicon film (not shown) of about 0.5 μm in thickness is formed. First and second basic patterns of polycrystalline silicon 212 and 214 are formed separately by applying a photolithographic technique and an isotropic etching technique to the first polycrystalline silicon layer. These first and second basic patterns have sidewalls substantially perpendicular to the top surface of the substrate, respectively. These first and second basic patterns 212 and 214 are positioned within the zone of the buried layer 202 when viewing the top surface of the foundation 206 from above. In particular, the former 212 is positioned on the epitaxial layer 204 at a predetermined area in which the active regions will be formed. The latter 214 is situated on the epitaxial layer 204 at an area in which the collector electrode will be formed. These basic patterns 212 and 214 are formed by a patterning through a single mask alignment with a single mask. Preferably, these basic patterns 212 and 214 are formed so as to have their minimum line width of, for example, 1 μm and the thickness of about 0.5 μm. The structure on which these complete basic patterns 212 and 214 are formed is shown in FIG. 5B.

In succession, the surfaces of the first and the second basic patterns 212 and 214 are thermally oxidized so as to form the first thermal oxide films 216 and 218 of about 0.4 μm in thickness. The first thermal oxide films 216 and 218 and the remained or residual island portions 220 and 222 of polycrystalline silicon constitute a first and second patterned structure 224 and 226, respectively. A structure thus obtained is shown in FIG. 5C. According to the embodiment of the present invention, it is preferable that these first thermal oxide films 216 and 218 have their thickness of about 0.4 μm.

Next, using these first and second patterned structures 224 and 226 as masks a portion of the structure shown in FIG. 5C which is not covered with the first thermal films 216, 218 is removed according to a suitable one of ordinal conventional process from the top surface of the first nitride film 210 down to the buffer layer 208. Subsequently, using an anisotropic etching technique effective along the direction perpendicular to the top surface of the foundation, the epitaxial layer 204 and a portion of the buried layer 202 in its thickness direction are sequentially etched away, thereby obtaining the structure shown in FIG. 5D. The structure as shown apparently has an first and second raised portions 230 and 232 respectively formed in an island fashion on the foundation 206. It is explicit from FIG. 5D that both the protrusions 230 and 232 are separated by a groove 234 forming a separation region between a base and a collector. These protrusions 230 and 232 are separated from other raised portions of the adjacent transistors (now shown) by grooves 236 for forming an isolation region between elements, The height of the first and the second raised portions 230 and 232 is determined to have, for example, about 1 μm. In FIG. 5D, respective remaining portions of the first nitride film 210, the buffer layer 208 and the epitaxial layer 210 are numbered with 238a and 240a, 242a and 238b, and 240b 242b.

According to the next step, inner wall of the grooves 234 and 236 mentioned above are thermally oxidized, so thin thermal oxide film 244 of a thickness, for example, of 300–500 Å is obtained. After that, a LPCVD process is applied to the whole top surface of the structure covered with the thermal oxide film so as to form a second nitride film 246 used as the third dielectric or insulating film of a thickness, for example, about 0.2 μm as shown in FIG. 5E.

The structure shown in FIG. 5E is exposed to an anisotropic etching effective perpendicularly to the top surface of the foundation in order to remove only the portion of the second nitride film 246 extending in parallel with the top surface of the foundation. As a result of the removal, the second nitride film 246 is remained only on the side faces of the first raised portion 230 and each films 240a, 238a, 216 situated on the raised portion 230, and the sidefaces of the second raised portion 232 and each films 240b, 238b, 218 positioned on the raised portion 232. The resultant structure is shown in FIG. 5F. The remained side face layers made of the nitride film are shown in the drawing by 246a and 246b. The role or effect of these sidewall layers 246a and 246b is to protect and prevent the sidefaces of the buffer layers or oxide films 240a and 240b from removing which will or apt to happen during the later steps.

Figure 5:
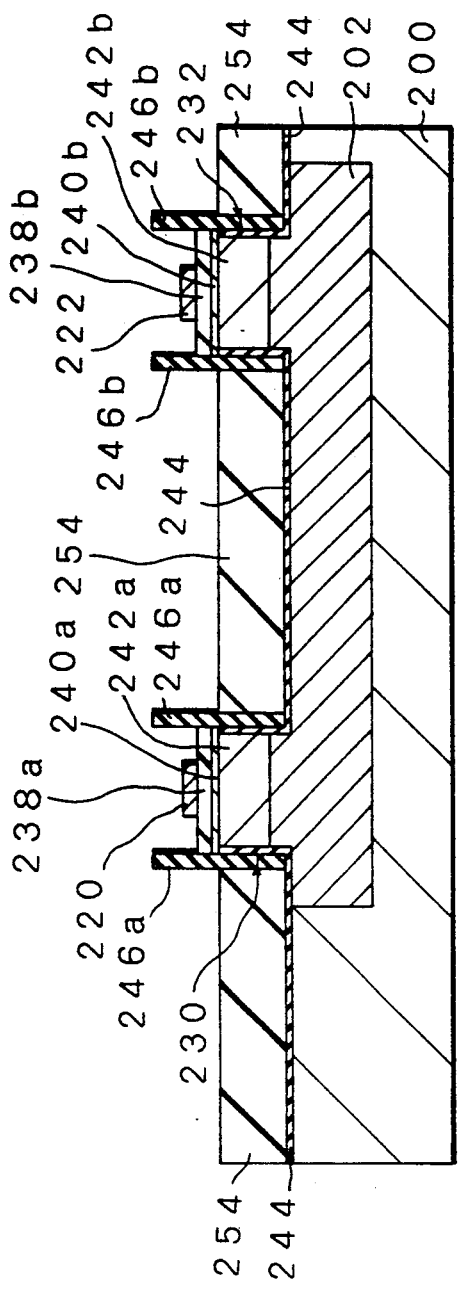
FIGS. 5A-5V are process diagrams for explaining a preferable example of a process for producing a semiconductor device according to the present invention.
Figure 5:
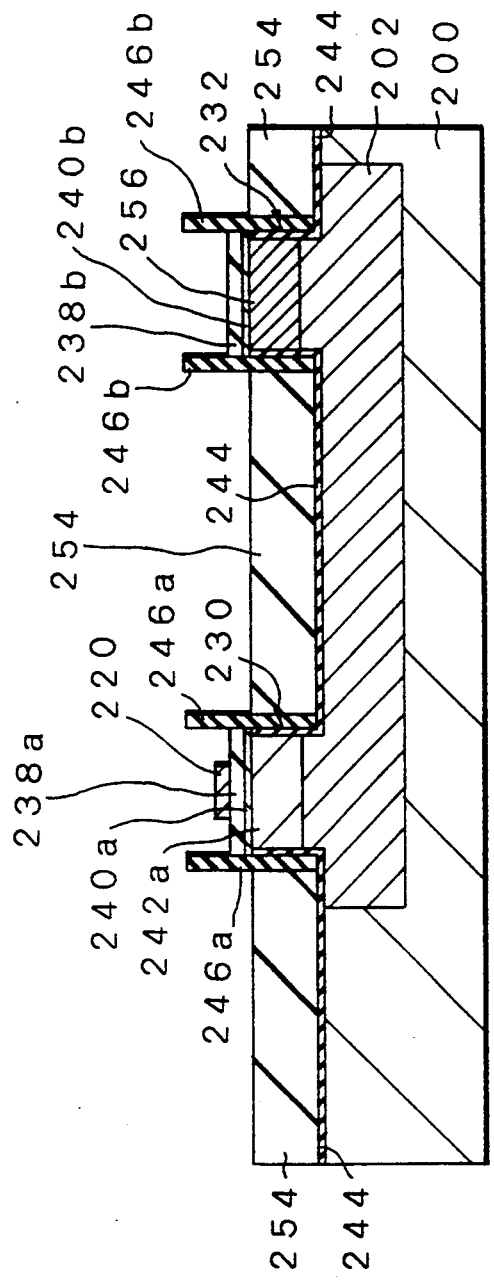

Next, a first dielectric or insulating region 254 is formed around the first and second raised portions 230 and 232 of the structure shown in FIG. 5, obtaining the new structure as shown in FIG. 5I. In order to obtain the new structure, a LPCVD method is carried out on the whole top surface of the structure shown in FIG. 5F to form a first CVD oxide film 250 of a uniform thickness, for example, about 1 μm used as the first dielectric or insulating film in order to obtain the transition structure as shown in FIG. 5G. The first CVD oxide film is made of, for example, a silicon oxide film.

Next, in order to make flat the top surface of the structure shown in FIG 5G, a planarization film 252 made of a resist is formed on the whole of the surface, thereby obtaining the structure shown in FIG. 5H. It is enough to form the resist planarization film 252 by one of the conventional ordinal methods.

In succession, the first thermal oxide films 216 and 218 are removed, by carrying out an ordinal etch back, from the top surface of the planarization film 252 and the first dielectric region 254 provided with a flat top surface is formed on the area corresponding to the grooves 236 and 234 (FIG. 5I). In this case, etch back preferably is carried out at substantially the same etching rate on the resist and the oxide film. This etch back stops at the top surfaces of the nitride films 238a and 238b of oxidation-resistant. Consequently, surroundings of the first and second raised portions 230 and 232 are buried by the remained or residual portion(s) of the first dielectric film with interposed portions of the sidewall layers (referred to as sideface protection films, also) 246a and 246b, and the thermal oxide film 244. Thus, the residual portion(s) constitutes a first dielectric region 254. Preferably, the top surface of the first dielectric region 254 has the substantial same level as that of the top surfaces of the first and the second raised portions 230 and 232. The first dielectric region 254 in the area of the groove 236 is used as a field region (isolation region) between elements and the first dielectric region 254 in the area of the groove 234 is used as a separation region between a base and a collector. After the carrying out of etch back, the sidewall layers 246a and 246b are still remained.

The island portion 222 of polycrystalline silicon, which has been formed on the area in which a collector electrode will be formed, is removed by a suitable conventional method. After that, ion implantation of a dose of about $1 \times 10^{15}/cm^2$ is carried out to the epitaxial layer 242b of the second raised portion 232 through the side of the nitride film 238b in order to change this epitaxial layer 242b to a low resistance region 256 of the collector resistance. As a result, the structure as shown in FIG. 5J is obtained. According to preferred embodiment, this region 256 is formed as an n+ region.

Next, the island portion 220 of first polycrystalline silicon remained on the top surface of the first raised portion 230 is thermally oxidized in order to completely change it to a thermal oxide film 260, obtaining the structure shown in FIG. 5K. Here this thermal oxide film 260 is referred to as a second thermal oxide film. In the case of the embodiment of the invention, viewing the structure from above, the second thermal oxide film 260 is placed in the area of the nitride film 238a of the oxidation-resistant film, under the film 260, and the peripheral surface area of the nitride film 238a is exposed around the second thermal oxide film 260. According to the particular embodiment above, the second thermal oxide film 260 has, for example, a thickness of about 0.6 μm.

Then, the exposed peripheral area of the nitride film 238a and all portions of the nitride film 238b are effectively removed by a suitable conventional etching technique other than an anisotropic one using the second thermal oxide film 260 and the first dielectric region 254 as masks. Simultaneously the portions of the sidewall layers 246a and 246b, respectively made of nitride films, which portions projecting above the top surfaces of the first dielectric region 254, are removed. Still more, remained or residual portions of the sidewall layers 246a and 246b are referred to as having reference numerals 248a and 248b. Then, an area(s) of the buffer layer 240a made of an oxide film, which areas being not caused with the second oxide film 260 and being exposed, and the buffer layer 240b are removed by a suitable conventional etching process, resulting in the structure of FIG. 5L. In the drawing, the oxidation-resistant nitride film remained still on the first raised portion 230 is shown by 262 and the remaining buffer layer is shown by 264, respectively. As shown in FIG. 5L, the third patterned structure 270 has the buffer layer 264, the oxidation-resistant film 262 and the second thermal oxide film 260, respectively on the top surface of the first raised portion 230. It is noted that levels of the epitaxial layer 242a of the first raised portion 230, the first dielectric region 254 and the low resistance region 256 are equal or substantially equal to each other. The peripheral surface area of the top surface of the epitaxial layer 242a, which area being not covered with the third patterned structure 270, is exposed.

Next, the second polycrystalline silicon pattern layer 280 is formed as shown by the structure of FIG. 5Q. The pattern layer 280 contacts with the peripheral surface area of the top surface of the exposed epitaxial layer 242a and also with the sideface of the third patterned structure 270. This pattern layer 280 corresponds to the pattern layer 130 explained with reference to the basic embodiment.

In order to form the pattern layer 280, using a sputtering or a LPCVD method, a second polycrystalline silicon layer 272 of a uniform thickness for example, of 0.4 μm is formed on the whole top surface of the structure shown in FIG. 5L to obtain the structure as shown in FIG. 5M. Next, impurity of a first conductive type of, here, p type is ion-implanted or doped at a high doping concentration from the top surface of the structure shown in FIG. 5M to the second polycrystalline layer 272. The dose of ions implanted is, for example, $1 \times 10^{15}/cm^2$.

All over the top surface of the second polycrystalline silicon layer 272 containing highly concentrated impurity, a planarization film 274 is formed using a resist material, thus obtaining the structure shown in FIG. 5N. It is convenient to use an appropriate well-known method in order to form the planarization film 274 of the resist material.

Next, the etch back is carried out from the top surface of the planarization film 274 using the top surface of the second polycrystalline silicon layer above the third patterned structure 270 as an etching stopper, to obtain the structure shown in FIG. 5O. Then, the selective etching is carried out to the top surface area of the second polycrystalline silicon layer, the top surface area being exposed due to the etch back above, by means of a mask of the remaining resist layer 276. The selective etching is effective to, for example, the middle level of the thickness of the second thermal oxide film 260. Preferably, the selective etching is effective or done to the same level as that of the top surface of the second polycrystalline silicon layer 272 on the first dielectric region 254. The resultant structure obtained after the selective etching is shown in FIG. 5P. The portion 278 of the second polycrystalline silicon layer remained after the etching has a thickness of, for example, 4000 Å.

Subsequently, the remaining resist film 276 is removed according to the appropriate well-known conventional method and then photoetching is applied to the residual or remaining portion 278 to carry out the patterning thereof. After the patterning process, the second polycrystalline silicon pattern layer 280 similar to that 130 shown in FIG. 3H can be obtained (FIG. 5Q). The second polycrystalline silicon pattern layer 280 will be used finally as a control electrode or a base electrode which will be explained later, so that the pattern layer 280 is suitably designed in its size, length and width. It is apparent that a patterning for the second polycrystalline silicon pattern layer 280 is done by a photoetching, and the patterning is not used to form active regions of the transistor according to the present invention.

Next, the second thermal oxide film 260 constituting the third patterned structure 270 is removed from the structure shown in FIG. 5Q by means of a conventional well-known method. After that, the second polycrystalline silicon pattern layer 280 is thermally oxidized in order to change the surface of the pattern layer 280 to a third thermal oxide film 282. During the thermal oxidation, the first conductive type impurity is thermally diffused into the epitaxial layer 242a contacting with the pattern layer 280 to form a low resistance region 284 shown in FIG. 5R. Furthermore, the portion of the control electrode contacting with the second thermal oxide film is formed in self-alignment manner.

The thickness of the third thermal oxide film 280 is, for example, 0.2 μm. The thickness of a portion of the remaining second polycrystalline silicon layer is, for example, 3000 Å and it constitutes a control electrode or accordingly a base electrode 286. Also, this thermal diffusion layer or a low resistance region 284 becomes an inactive base region. Because that dielectric films 244 and 248a are formed at the sidewall of the first raised portion 230, no thermal diffusion of impurity is generated in a lateral direction toward the outside of the area of the first projected portion 230. Consequently, as already described concerning FIG. 3I, it is no possibility of expanding the outermost boundary of the control electrode or base region beyond the previously decided limits of the first raised portion 230.

Further, during the thermal oxidation of the pattern layer 280 above, the top surface of the low resistance region 256 of the collector electrode region is thermally oxidized, thereby, forming a thermal oxide film 290.

After the oxidation-resistant film 262 is removed from the structure shown in FIG. 5R, ion-implantation of the first conductive type, for example in this case, a p type impurity is done from above toward the epitaxial layer 242a having formed thereon the thermal diffusion layer 284. Because the ion-implantation is done with a low dose, such as 1 to $5 \times 10^{13}/cm^2$, it is possible to carry out the ion-implantation without a mask. The ion-implantation forms an impurity implanted region or dosed region 292 in the epitaxial layer 242a. This dosed region 292 is activated in appropriate steps.

After formation of the impurity implanted region 292 and the thermal diffusion layer 284, the portion of the epitaxial layer remained under them becomes a collector electrode region 294 of a second principal electrode region. The structure thus obtained is shown in FIG. 5S.

At this stage, the buffer layer 264, as well as a part of side faces of the base electrode 286 are exposed due to the removal of the oxidation-resistant film 262, so that a second dielectric or insulating film (not shown) of a uniform thickness of, for example, 0.2 μm is once formed over the whole top surface of the structure having an impurity implanted region 292 by means of a LCVD method. It is preferable that the second dielectric film is a CVD oxide film such, for example, as a silicon oxide film. An anisotropic etching is carried out on the CVD oxide film along the direction perpendicular to the top surface of the foundation in order to form a sidewall layer 300 at the side faces of the base electrode 286 and the third thermal oxide film 282, respectively placed above the buffer layer 264, thus obtaining the resultant structure as shown in FIG. 5T. Other remaining portions 302 of the CVD oxide film are shown in FIG. 5T.

In the next step, using the sidewall layer 300 as a mask, the exposed portion of the buffer layer 264 is removed or eliminated from the latter layer 264 by an etching, thus the top surface of the first raised portion 230 or, consequently in this case, the impurity implanted region 292 is exposed. The remaining portion of the buffer layer is shown by 264 (FIG. 5U). In succession, an emitter electrode 304 is formed on the top surface of the exposed impurity implanted region 292. Previously the emitter electrode 304 contains impurity of the second conductive type, in the embodiment, an n type of so high concentration as, for example, $1 \times 10^{20}/cm^3$. Similar to the case of the second polycrystalline silicon pattern layer 280 shown in FIG. 5Q, the emitter electrode 304 is then patterned after n type impurity is doped at a high concentration to the polycrystalline silicon layer. As a result, here the emitter electrode 304 has a third polycrystalline silicon pattern layer formed thereon (FIG. 5U). Continuously, the emitter electrode 304 containing at a high concentration the n type impurity is thermally treated in order to thermally diffuse the impurity into the impurity implanted region 292. Due to the thermal diffusion, a part of the impurity implanted region 292 is changed to an type region which serves as an emitter region 306. Consequently, the remaining area of the impurity implanted region 292 becomes an active base region 308. The active base region 308 and the low resistance layer 284 constitute a single base region 310 as shown by the structure in FIG. 5U.

Subsequently, using a LPCVD method, a suitable dielectric or insulating film (not shown) of the third CVD oxide film or the like is formed on the whole top surface of the structure shown in FIG. 5U, then contact holes and metal wiring or interconnecting layers are formed sequentially. The resulting structure is shown in FIG. 5V. It is apparent that the third CVD oxide film 321, the contact holes 314, 316, 318 and metal wiring layers 320, 322, 324 constitute parts of the structure above, respectively.

Thus a process for producing of the semiconductor device of the embodiment according to the present invention is over.

Figure 3:
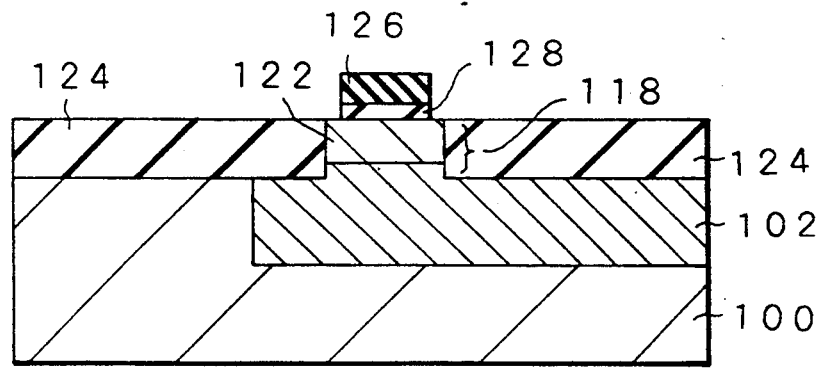
FIGS. 3A-3L are process diagrams for explaining a preferable fundamental example of a process for producing a semiconductor device according to the present invention.
Figure 3:
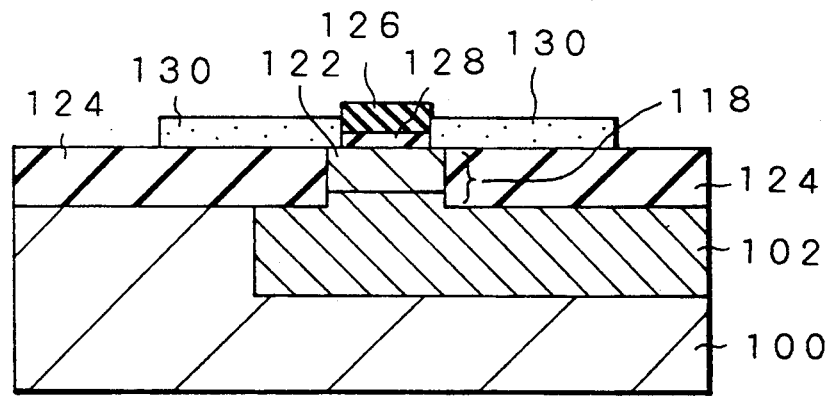
Figure 3:
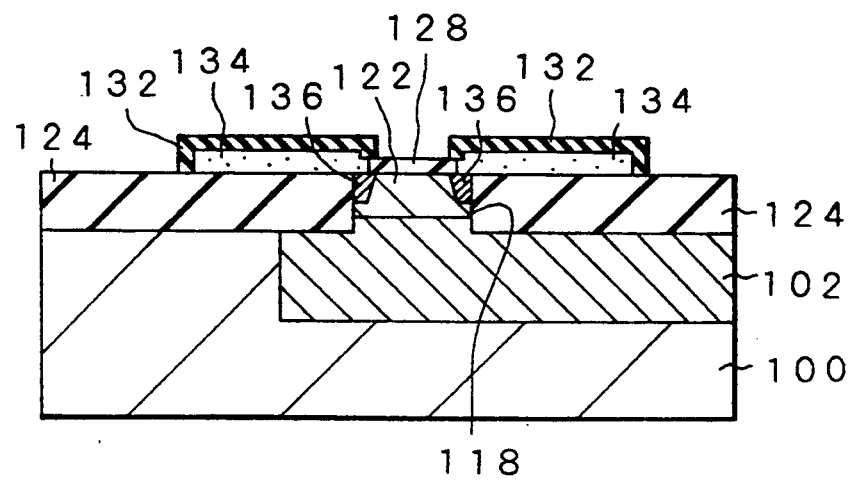
Figure 3:
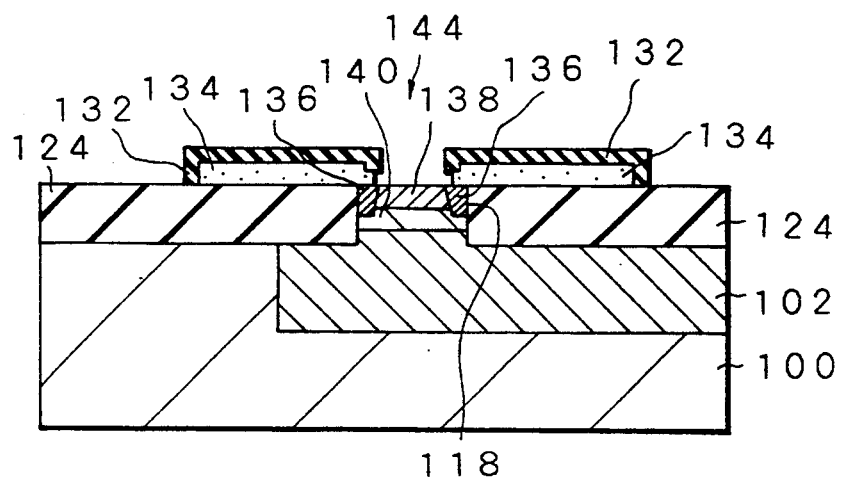
Figure 3:
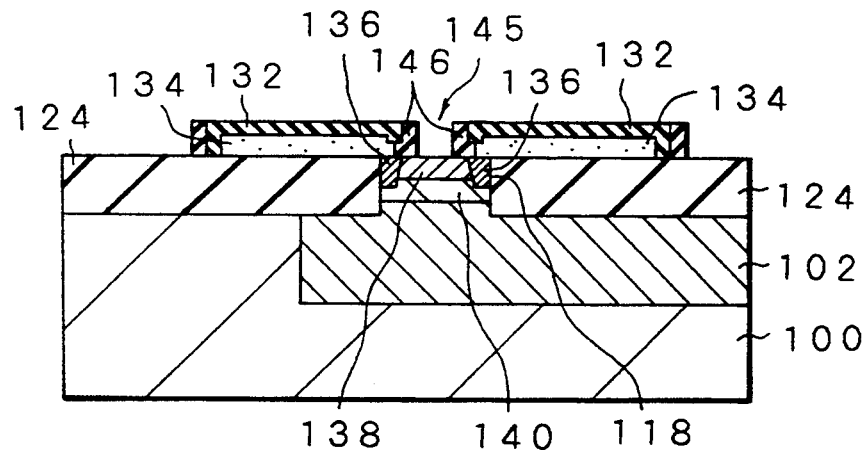
Figure 3:
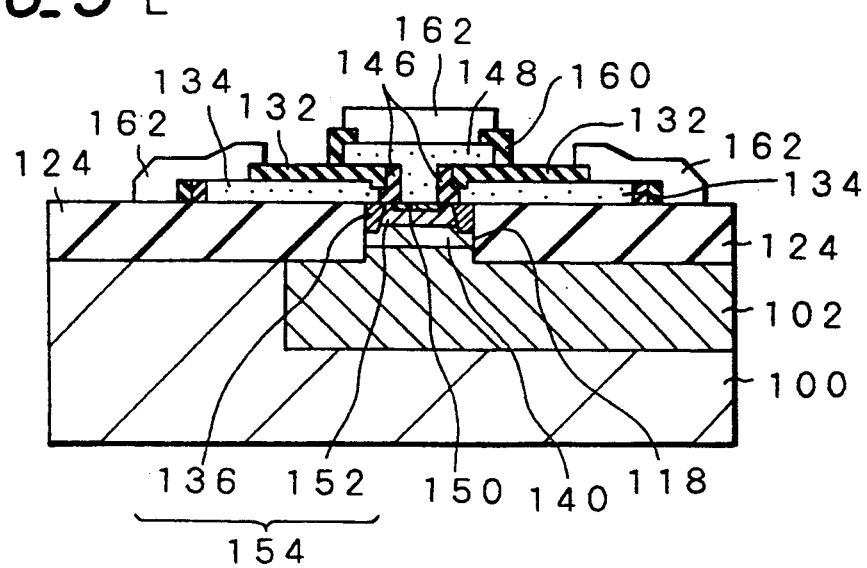

According to the embodiment mentioned-above, similar to the embodiment explained with reference to FIG. 3, the active regions of the semiconductor device can be formed by a single mask alignment process and self-alignment technology carried out thereafter. Further, because the first raised portion 230 in which these active regions (an emitter, a base and a collector) will be formed is previously formed, the dielectric layers 244, 248a, 254 of the field regions are formed around the first raised portion 230, and then these active regions (294, 306, 310) are formed in a self-alignment manner, there is no fear of expanding in the lateral direction of the base region 310. Consequently, the area through which the base region 310 and the collector region are made contact with each other is substantially decided by a zone occupied by the first raised portion 230. The zone lies in a plane being in parallel with the top surface of the foundation. The area of the zone occupied by the raised portion 230 is decided by a line width and a length of the first basic pattern 212 formed at an early stage on the top surface of the foundation in order to form the first raised portion 230. In consequence, it is possible to make the area through which the base and the collector come into contact with each other minimum when mainly the basic pattern 212 is formed with the line of the minimum width.

As already explained, decision of line width of the first basic pattern decides the width of the base region without such enlargement of the width of the base region as was experienced in the conventional technique, so that it is not necessary to have some allowance or margin for the mask alignment when forming the first basic pattern 212. In consequence, it is possible to make smaller or narrow the active regions surrounded by the field region. It is noted that, according to the concrete embodiment, the section of the active regions are substantially identical to that of the first raised portion 230. As a result, if it is necessary to form the buried layer 202 for extending the collector electrode region, the section of the buried layer 202 can be formed narrower than that of the conventional one, resulting in small contacting area between the collector region 202 and the substrate 200. Even the case of the semiconductor device manufactured according to the embodiment, similar to the case of the basic embodiment described with reference to FIG. 4, it is possible to make various sections of the active regions, as well as of the base regions and the collector regions extraordinarily smaller than those of the conventional semiconductor device.

It is apparent from the description of the basic embodiment and the concrete embodiment as mentioned above that according to the present invention:

(i) The basic pattern having the minimum line width or a mask pattern having the lines of minimum width is used to form an emitter region of narrower width;

(ii) By using the same basic pattern, an emitter electrode and an inactive base region or a low resistance region (or diffused layer) is formed respectively with getting near to each other as near as possible without enlarging the base resistance;

(iii) It is decided that the area occupied by the portion containing the collector electrode region, the base electrode region and the emitter electrode region in a plane which is in parallel with the top surface of the foundation, by means of a single mask alignment or a photoetching using a single mask;

(iv) A field region of a dielectric layer around the occupied area is formed to make it a portion of the active region, and consequently, even an impurity thermal diffusion for forming an inactive base region in the active region is done at a later stage, it is suppressed to laterally diffused the impurity toward out of the occupied area. As a result, the expanding or enlarging of the base region out of the occupied area is avoided; and (v) When the mask pattern is made to have the minimum line width, respective width of the active regions, that are the collector electrode region, as well as the base electrode region is made of the minimum one. In consequence, the base-collector contacting area is made minimum, and the other contacting area between the collector and the substrate is also made minimum, resulting in the minimum area of the foundation occupied by the transistor. Consequently, it is possible to make the level of integration higher than that of the conventional technique and to operate the transistor at a speed higher than the conventional one. In addition, it is possible to expect manufacturing of the type of transistors consuming small power.

It is explicit that the present invention is not limited to the various embodiments mentioned above. For example, the numerical conditions described above in the explanation of the various embodiments according to the present invention are merely examples and they can be changed according to the design of manufacturing the transistors. Also, film forming material, film forming condition, thermal diffusion condition, etching condition and etching method, respectively necessary to obtain the structure(s) shown in the drawings, and other various conditions necessary to produce the semiconductor devices of the present invention can be appropriately selected at will according to the design.

In the both embodiment, the first principal electrode is presumably an emitter electrode and the second principal electrode is too presumably a collector one, however it is apparently possible to use the first principal electrode as a collector electrode and the second principal electrode as an emitter electrode constructing a structure of the semiconductor and attaining the same operative effect as that described above.

According to the embodiments, the first conductive type is made of p type and the second conductive type is made of n type, however it is possible to change the types with each other.

Both the embodiments have been explained with reference to the structures of semiconductors provided with buried diffusion layers, however instead of forming the buried diffusion layers, it is possible to form the epitaxial layer as a high concentration impurity added region and use the epitaxial layer as a region extending from the second principal electrode region.

What is claimed is:

1. A process for producing a semiconductor device in an integrated circuit, the semiconductor device having therein first second principal electrode regions as well as a control electrode region, comprising the step of:

(a) forming a patterned structure on a top surface of a monocrystalline or single crystal silicon foundation through an oxidation-resistant film, the patterned structure having an island-like portion of a first polycrystalline silicon and a first thermal oxide film on the island-like portion;

(b) forming a raised portion used to form respective electrode regions therein by utilizing etching effective a top surface of the oxidation-resistant film down to the foundation partially in a thicknesswise direction thereof except for an area under the raised portion, while using the patterned structure as a mask;

(c) forming a first insulating region around the raised portion;

(d) changing the first polycrystalline silicon of the island-like portion to a second thermal oxide film by the thermal oxidation treatment after the first thermal oxide film is removed, said second thermal oxide film being in the condition in which the peripheral area of a remaining oxidation-resistant film surrounding the second thermal oxide film is exposed;

(e) removing the exposed peripheral area of the oxidation-resistant film in order to expose the peripheral area of the top surface of the raised portion;

(f) forming a second polycrystalline silicon pattern layer coming in contact with the exposed peripheral area of the top surface and extending from a sideface of said second thermal oxide film and the remaining oxidation-resistant film onto the first insulating region, said second polycrystalline silicon pattern layer containing a first conductive type impurity at a high concentration;

(g) carrying out a thermal treatment to the second polycrystalline silicon pattern layer after the second thermal oxide film is removed, in order to form a third thermal oxide film on the surface of the second polycrystalline silicon pattern layer and a remaining portion thereof to be used as a control electrode, during which thermal treatment the first conductive type impurity is thermally diffused from the second polycrystalline silicon pattern layer into the peripheral area of the raised portion to form a low resistance regions(s) therein;

(h) removing the remaining oxidation-resistant film to expose the top surface of the raised portion;

(i) doping an impurity of a first conductive type into the raised portion from the top surface thereof to form a doped region(s) surrounded by the low resistance region(s) in the raised portion;

(j) forming a sidewall layer of a second insulating film on the top surface of the raised portion and on a sideface of the control electrode and of the third thermal oxide film, so as to define an impurity diffused region within the doped region(s);

(k) forming a third polycrystalline silicon pattern layer on the exposed area of the top surface of the raised portion, the third polycrystalline silicon pattern layer containing therein a second conductive type impurity at a high concentration; and (l) thermally diffusing the second conductive type impurity from the third polycrystalline silicon pattern layer into the doped region(s) to form the impurity diffused region, thereby obtaining the impurity diffused region serving as the first principal electrode region, the low resistance region and the remaining portion of the doped region(s) serving as the control electrode region, and a remaining region of the raised portion under the control electrode region serving as the second principal electrode region.

2. The process of claim 1, wherein the patterned structure is obtained via the following substeps of:
forming a first polycrystalline silicon layer on the oxidation-resistant film;
subsequently forming an island-like portion of the first polycrystalline silicon by means of photoetching and anisotropic etching techniques applied to the first polycrystalline silicon layer; and
subsequently thermally oxidizing the island-like portion of the first polycrystalline silicon at the surface portion thereof to change it into the first thermal oxide film.

3. The process of claim 1, wherein the first insulating region is obtained via the following substeps of:
forming a first insulating film covering whole exposed surfaces of the raised portion and the foundation;
subsequently forming a planarizing film of resist material on the first insulating film; and
subsequently etching back the planarizing film and the first insulating film from the top surface of the planarizing film down to the level with the top surface of the raised portion to obtain a remaining portion of the first insulating film as the first insulating region.

4. The process of claim 1, wherein the first insulating region is formed with a first CVD oxide film formed by an LPCVD method.

5. The process of claim 1, wherein the removal of the oxidation-resistant film is carried out by using an etching technique other than an anisotropic etching technique.

6. The claim of claim 1, wherein the second polycrystalline silicon pattern layer is formed via the following substeps of:
forming an uniform-thickness film of said second polycrystalline silicon layer on the top surface of the structure obtained by the step (e); and
then patterning the second polycrystalline silicon layer.

7. The process of claim 6, wherein the second polycrystalline silicon layer is formed by a sputtering or an LPCVD technique.

8. The process of claim 6, wherein the first conductive type impurity is doped in the second polycrystalline silicon layer after a forming of the second polycrystalline silicon layer and before the patterning thereof.

9. The process of claim 6, wherein after the formation of the second polycrystalline silicon layer and before the patterning thereof, the following substeps are carried out:
doping the first conductive type impurity at a high concentration in the second polycrystalline silicon layer;
then forming the planarizing film on the second polycrystalline silicon layer containing the impurity;
subsequently etching the planarizing film using the top surface of the impurity containing portion of said second polycrystalline silicon layer above the raised portion as an etching stopper;
subsequently selectively etching the impurity containing portion of said polycrystalline silicon layer and the second thermal oxide film from the exposed top surface of the impurity containing polycrystalline silicon layer portion down to the middle of the second thermal oxide film; and
then removing the remaining portion of the planarizing film of the resist material.

10. The process of claim 1, wherein the single crystal foundation is essentially composed of the first conductive type silicon substrate and a second conductive type epitaxial layer provided thereon.

11. The process of claim 10, wherein the silicon substrate has provided therein a second conductive type buried layer used as a portion extending from the second principal electrode region.

12. The process of claim 1, wherein the first conductive type is a p conductive type and the second conductive type is an n conductive type.

13. The process of claim 1, wherein the oxidation-resistant film is a nitride film.

14. The process of claim 1, wherein the first insulating film is a second CVD oxide film formed by a CVD method.

15. The process of claim 1, wherein the first and second insulating films are silicon oxide films.

16. The process of claim 1, wherein a buffer layer is formed on the top surface of the foundation and the oxidation-resistant film is formed on the buffer layer.

17. The process of claim 1, further including following substeps of:

forming a buffer layer between the foundation and the oxidation-resistant film;

forming a thin thermal oxide film, before the step (c) above, on a surface of the foundation and the sidewall of raised portion, respectively exposed by the etching of the step (b) above by means of a thermal oxidation;

forming a third insulating film on the whole surface of the top surface of the structure having the thin thermal oxide film formed thereon; and carrying out an anisotropic etching along the direction perpendicular to the surface of the foundation to said third insulating film in order to form sideface protective film consisting of the remaining portion of the third insulating film at the sideface of the patterned structure and the raised portion.

18. The process of claim 17, wherein the third insulating film is a nitride film formed by an LPCVD technique.

19. The process of claim 17, further including the following substeps of;

forming a first insulating film of uniform thickness on the whole top surface of the structure having the sideface protective film formed thereon;

forming a planarizing film of resist material on the insulating film;

etching the first thermal oxide film and etching partially the first insulating film, while using the oxidation-resistant film as an etching stopper, to form the first insulating region by the remaining portion of the first insulating film; and then, removing partially the oxidation-resistant film, the buffer layer and the sideface protective film, respectively, while using the second thermal oxide film as a mask in the step (e) above.

20. A process for manufacturing a semiconductor device comprising the steps of:

forming on a semiconductor substrate a first patterned layer and a second patterned layer covering the top surface and the peripheral area of the first patterned layer, wherein the material of the first patterned layer is different from the second patterned layer's;

defining a first area of the semiconductor substrate by using the second patterned layer as a mask;

removing the second patterned layer to expose a peripheral part of the first area of the semiconductor substrate;

forming a first electrode on the peripheral part of the first area, the first electrode including an impurity of a first conductive type;

forming an isolation layer on the electrode;

introducing the impurity of the first conductive type from the first electrode to the peripheral part of the semiconductor substrate to form a first impurity region;

removing the first patterned layer to expose a central part of the first area surrounded by the peripheral part and to expose a vertical edge of the first electrode;

introducing an impurity into the central part of the semiconductor substrate to form a second impurity region surrounded by the first impurity region;

forming a sidewall on the vertical edge of the first electrode and the part of the central part of the first area to define a third impurity region within the second impurity region; and forming a second electrode on the third impurity region.

21. A process for manufacturing a semiconductor device comprising the steps of:

forming on a semiconductor substrate a first patterned layer and a second patterned layer covering the top surface and the peripheral area of the first patterned layer, wherein, the material of the first patterned layer is different from the second patterned layer's;

etching a semiconductor substrate using the second patterned layer as a mask to form an opening portion;

filling an insulating material in the opening portion of the semiconductor substrate to form a semiconductor mesa region surrounded by the insulating material;

removing the second patterned layer to expose a peripheral part of the mesa region;

forming a first electrode on the peripheral part of the mesa region, the first electrode extending from the mesa region to a region over the insulating material and including a first conductive type impurity;

introducing the impurity from the first electrode to the peripheral part of the semiconductor substrate to form a first impurity region;

removing the first patterned layer to expose a central part of the mesa region surrounded by the peripheral part and to expose a vertical edge of the first electrode;

introducing a first conductive type impurity into the central part of the semiconductor substrate to form a second impurity region surrounded by the first impurity region;

forming a sidewall on the vertical edge of the first electrode and the part of the central part of the first area to define a third impurity region within the second impurity region; and forming a second electrode on the third impurity region.

22. A process for manufacturing a semiconductor device according to claim 20, wherein the second electrode includes a second conductive type impurity.

23. A process for manufacturing a semiconductor device according to claim 22, further comprising the step of introducing the second conductive type impurity from the second electrode into the third impurity region.

24. A process for manufacturing a semiconductor device according to claim 21, wherein the second electrode includes a second conductive type impurity.

25. A process for manufacturing a semiconductor device according to claim 24, further comprising the step of introducing the second conductive type impurity from the second electrode into the third impurity region.

* * * * *